United States Patent
Doi et al.

(10) Patent No.: US 10,411,183 B2
(45) Date of Patent: *Sep. 10, 2019

(54) COMPOSITION FOR FORMING MN-DOPED PZT-BASED PIEZOELECTRIC FILM AND MN-DOPED PZT-BASED PIEZOELECTRIC FILM

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Matsudo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 33 days.

This patent is subject to a terminal disclaimer.

(21) Appl. No.: 15/129,077

(22) PCT Filed: Mar. 27, 2015

(86) PCT No.: PCT/JP2015/059619
§ 371 (c)(1),
(2) Date: Sep. 26, 2016

(87) PCT Pub. No.: WO2015/147259
PCT Pub. Date: Oct. 1, 2015

(65) Prior Publication Data
US 2017/0222127 A1 Aug. 3, 2017

(30) Foreign Application Priority Data

Mar. 27, 2014 (JP) .................................. 2014-065635
Feb. 4, 2015 (JP) .................................. 2015-019859

(51) Int. Cl.
*C04B 35/493* (2006.01)
*C04B 35/622* (2006.01)
(Continued)

(52) U.S. Cl.
CPC ........ *H01L 41/1876* (2013.01); *C04B 35/491* (2013.01); *C04B 35/493* (2013.01);
(Continued)

(58) Field of Classification Search
None
See application file for complete search history.

(56) References Cited

U.S. PATENT DOCUMENTS 6,066,581 A * 5/2000 Chivukula ............ C04B 35/491
106/287.19
6,086,665 A * 7/2000 Kamisawa .......... C23C 18/1216
106/287.18
(Continued)

FOREIGN PATENT DOCUMENTS

CN 1922743 A 2/2007
CN 1983464 A 6/2007
(Continued)

OTHER PUBLICATIONS

Wasa et al, "Microstructure and Piezoelectric Properties of PZT-based Ternary Perovskite Pb(Mn, Nb)O3-PZT Thin Films," Applications of Ferroelectrics, ISAF 2009, 18th IEEE International Symposium, Aug. 27, 2009, pp. 1-5 (Year: 2009).*
(Continued)

*Primary Examiner* — Colin W. Slifka
(74) *Attorney, Agent, or Firm* — Locke Lord LLP

(57) ABSTRACT

A composition for forming a PZT-based piezoelectric film formed of Mn-doped composite metal oxides is provided, the composition including: PZT-based precursors containing metal atoms configuring the composite metal oxides; a diol; and polyvinylpyrrolidone, in which when a metal atom ratio in the composition is shown as Pb:Mn:Zr:Ti, the PZT-based precursors are contained so that a metal atom ratio of Pb is satisfied to be from 1.00 to 1.20, a metal atom ratio of Mn
(Continued)

is satisfied to be equal to or greater than 0.002 and less than 0.05, a metal atom ratio of Zr is satisfied to be from 0.40 to 0.55, a metal atom ratio of Ti is satisfied to be from 0.45 to 0.60, and the total of Zr and Ti in a metal atom ratio is 1.

8 Claims, 3 Drawing Sheets

(51) Int. Cl.
| | | |
|---|---|---|
| C04B 35/624 | (2006.01) | |
| C04B 35/626 | (2006.01) | |
| C04B 35/634 | (2006.01) | |
| C04B 35/638 | (2006.01) | |
| C04B 35/64 | (2006.01) | |
| H01L 41/187 | (2006.01) | |
| H01L 41/318 | (2013.01) | |
| C04B 35/491 | (2006.01) | |

(52) U.S. Cl.
CPC ........ *C04B 35/624* (2013.01); *C04B 35/6264* (2013.01); *C04B 35/62218* (2013.01); *C04B 35/638* (2013.01); *C04B 35/63444* (2013.01); *C04B 35/64* (2013.01); *H01L 41/318* (2013.01); *C04B 2235/3227* (2013.01); *C04B 2235/3234* (2013.01); *C04B 2235/3249* (2013.01); *C04B 2235/3251* (2013.01); *C04B 2235/3262* (2013.01); *C04B 2235/3268* (2013.01); *C04B 2235/3296* (2013.01); *C04B 2235/441* (2013.01); *C04B 2235/449* (2013.01); *C04B 2235/5436* (2013.01); *C04B 2235/6562* (2013.01); *C04B 2235/6567* (2013.01); *C04B 2235/74* (2013.01); *C04B 2235/787* (2013.01); *C04B 2235/79* (2013.01); *C04B 2235/95* (2013.01); *C04B 2235/96* (2013.01)

(56) References Cited

U.S. PATENT DOCUMENTS

| | | | |
|---|---|---|---|
| 2009/0246360 A1 | 10/2009 | Hamada et al. | |
| 2013/0256580 A1 | 10/2013 | Doi et al. | |
| 2013/0257228 A1 | 10/2013 | Noguchi et al. | |
| 2014/0287251 A1* | 9/2014 | Doi | C23C 18/1216 428/457 |

FOREIGN PATENT DOCUMENTS

| | | |
|---|---|---|
| CN | 103359785 A | 10/2013 |
| EP | 2645441 A2 | 10/2013 |
| EP | 2784136 A1 | 10/2014 |
| EP | 2784137 A1 | 10/2014 |
| JP | 09-223830 A | 8/1997 |
| JP | 10-081016 A | 3/1998 |
| JP | 2001-261338 A | 9/2001 |
| JP | 2003-221229 A | 8/2003 |
| JP | 2009-290364 A | 12/2009 |
| JP | 2009-290369 A | 12/2009 |
| JP | 2012-256850 A | 12/2012 |
| JP | 2012-256851 A | 12/2012 |
| JP | 2013-211309 A | 10/2013 |
| JP | 2013-211328 A | 10/2013 |
| TW | 201314708 A | 4/2013 |
| TW | 201402520 A | 1/2014 |
| WO | 2007/029789 A1 | 3/2007 |

OTHER PUBLICATIONS

Wanlin Zhu et al., "Influence of Mn doping on domain wall motion in Pb(Zr0.52Ti0.48)O3 films," J.Appl. Phys, vol. 109, Mar. 18, 2011, pp. 064105 to 064105-6 and information sheet. (cited in the Dec. 28, 2017 OA issued for CN201580015871.3).

Q Zhang et al., "Sol-gel PZT and Mn-doped PZT thin films for pyroelectric applications, " Journal of Physics D: Applied Physics, vol. 34, Jul. 17, 2001, pp. 2296-2301 and information sheet. (cited in the Dec. 28, 2017 OA issued for CN201580015871.3).

Gun-Tae Park et al, "Piezoelectric and ferroelectric properties of 1-μm-thick lead zirconate titanate film fabricated by a double-spin-coating process," Applied Physics Letters, vol. 85, No. 12, Jul. 17, 2004, pp. 2322-2324 and information sheet. (cited in the Dec. 28, 2017 OA issued for CN201580015871.3).

Office Action dated Dec. 28, 2017, issued for the Chinese patent application No. 201580015871.3 and partial English translation of the search report.

Supplementary European Search Report dated Oct. 10, 2017, issued for the European patent application No. 15769102.3.

A. L. Kholkin et al., "Self-Polarization Effect in Pb(Zr,Ti)O3 Thin Films," Integrated Ferroelectrics, 1998, vol. 22, pp. 525-533. (discussed in the spec).

Q. Zhang et al., "Hysteretic properties of Mn-doped Pb(Zr, Ti)O3 thin films," Journal of the European Ceramic Society, 2004, vol. 24, Issue 2, pp. 277-282. (cited in the ISR).

International Search Report dated Jun. 23, 2015, issued for PCT/JP2015/059619 and English translation thereof.

Office Action dated Jul. 23, 2018, issued for the counterpart application TW104110055 and a partial English translation of the search report.

Office Action dated Mar. 7, 2017, issued for the Japanese patent application No. 2016-510226 and English translation thereof.

Office Action dated Jul. 25, 2017, issued for the Japanese patent application No. 2016-510226 and English translation thereof.

Kiyotaka Wasa et al., "PZT-based high coupling with low permittivity thin films", 2013 Joint IEEE International Symposium on Applications of Ferroelectric and Workshop on Piezoresponse Force Microscopy (ISAF/PFM), IEEE, Jul. 21, 2013, pp. 69-72. (cited in the Oct. 27, 2017 EP Search Report issued for EP15770305.9).

P. Victor et al., "Effect of Manganese Doping on the Electrical Characteristics of Sol-Gel Derived Lead Zirconate Titanate Thin Films", Integrated Ferroelectrics, vol. 82, No. 1, Nov. 1, 2006, pp. 65-80 and a cover page. (cited in the Oct. 27, 2017 EP Search Report issued for EP15770305.9).

Supplementary European Search Report dated Oct. 27, 20178, issued for the European patent application No. 15770305.9.

Office Action dated Mar. 28, 2018, issued for the Chinese patent application No. 201580006889.7 and English translation thereof.

Office Action dated Apr. 16, 2018, issued for the Taiwanese patent application No. 104107912 and English translation thereof.

Office Action dated Jul. 21, 2017, issued for U.S. Appl. No. 15/127,531.

Jian Zhong et al., "Effect of Nb Doping on Highly[100]-Textured PZT Films Grown on CSD-Prepared PbTiO3 Seed Layers", Integrated Ferroelectrics, 130, 2011, pp. 1-11 (discussed in the spec).

K. Wasa et al., "Microstructure and Piezoelectric Properties of PZT-based Ternary Perovskite Pb(Mn,Nb)O3-PZT Thin Films", Applications of Ferroelectrics, 2009, ISAF 2009. 18th IEEE International Symposium on the, Aug. 27, 2009, pp. 1-5 (cited in the ISR).

International Search Report dated May 19, 2015, issued for PCT/JP2015/057297 and English translation thereof.

Supplementary European Search Report dated Oct. 27, 2017, issued for the European patent application No. 15770305.9.

\* cited by examiner

COMPOSITION FOR FORMING MN-DOPED PZT-BASED PIEZOELECTRIC FILM AND MN-DOPED PZT-BASED PIEZOELECTRIC FILM

TECHNICAL FIELD

The present invention relates to a composition for forming a Mn-doped PZT-based piezoelectric film and a Mn-doped PZT-based piezoelectric film.

According to a first aspect of the present invention, a Mn-doped PZT-based piezoelectric film is used in a piezoelectric element, an integrated passive device (IPD), and a pyroelectric element.

According to a second aspect of the present invention, a Mn-doped PZT-based piezoelectric film is used in a gyro sensor, an infrared sensor, a piezoelectric sensor, an ink jet head, and an auto focus. More specifically, the second aspect relates to a Mn-doped PZT-based piezoelectric film having excellent stability after a polarization process which is suitable for use in the various sensors described above.

Priority is claimed on Japanese Patent Application No. 2014-065635, filed Mar. 27, 2014, and Japanese Patent Application No. 2015-019859, filed Feb. 4, 2015, the content of which is incorporated herein by reference.

BACKGROUND ART

A ferroelectric film of PZT or the like formed by using a chemical solution deposition (CSD) method represented by a sol-gel method cannot be used as a piezoelectric material immediately after being formed, and a polarization process is necessarily performed in order to use the ferroelectric film in a gyro sensor or the like. In a case of using this film in a sensor such as a pyroelectric sensor or a gyro sensor, a performance index g of a piezoelectric film used is represented by the following Formula (1).

$$g(V \cdot m/N) = d_{31}/\varepsilon_{33} \quad (1)$$

In Formula (1), $d_{31}$ represents a piezoelectric constant and $\varepsilon_{33}$ represents a permittivity.

That is, in a case of using a ferroelectric film of PZT or the like in a sensor such as a pyroelectric sensor or a gyro sensor, it is generally desirable that a piezoelectric constant of a film be great and a permittivity or a dielectric loss (tan δ) of a film be low. In addition, it is desirable that polarization directions of a film be aligned immediately after a film is formed from the viewpoints of stability of polarization and omitting a polarization step.

In a case of using such a film in an actuator of an ink jet head or the like, the film is used by applying a high voltage, and accordingly, a polarization process is not necessary. This is because, in a case of using a ferroelectric film by applying a high voltage, polarization is performed with a driving voltage, even when polarization directions of the film are not aligned immediately after the film is formed, for example. However, even if a polarization process is performed, depolarization may occur at the time of a thermal treatment such as a reflowing process after the polarization process.

Regarding such problems, a self-poling phenomenon of a PZT film has been investigated and the result thereof shows possibilities that pinning of domains due to defects in a film is a main reason for the phenomenon (for example, see Non-Patent Document 1).

Also, in a field of piezoelectric bodies, there is a problem regarding productivity when performing film formation by using a CSD method. In a case of considering productivity, it is desired that a deposition rate be as high as possible, but, in a case of forming a PZT film by using a sol-gel method, for example, a high-temperature process such as calcination or sintering is generally performed in a sol-gel method. Thus, when it is desired to obtain a thicker film by increasing a single coating amount, tensile stress generated in a film at the time of sintering or the like increases and cracks may be generated on the formed film. When cracks are generated on the formed film, electric properties of a ferroelectric film are deteriorated. Accordingly, in the related art, a thickness of a film to be formed by a single application is limited to be approximately 100 nm in a sol-gel method, and in a case of forming a ferroelectric film having a certain thickness, a method of repeating application or sintering of a composition several times has been employed.

However, in this method, production efficiency is deteriorated and manufacturing cost is increased. Therefore, improvement related to materials, that is, research or development of a raw material solution which causes an increase in a film thickness formed by a single application, without generating cracks, has been performed. Patent Document 1, for example, discloses a raw material solution for forming a metal oxide thin film containing Ti in which propylene glycol is added to the raw material solution. A film having a thickness equal to or greater than 0.2 μm can be formed by a single application of this raw material solution, without generating cracks.

In addition, a CSD method represented by a sol-gel method and a sputtering method are well known as a method of manufacturing a PZT-based film used as a piezoelectric micro-electro mechanical system (MEMS) device. A PZT-based film manufactured by a CSD method generally has a high dielectric breakdown voltage and therefore is suitable as a high-voltage driving device such as an ink jet head. In contrast, a PZT-based film manufactured by a sputtering method has compressive stress due to an injection effect at the time of forming a film in many cases, and is oriented to the (001) plane. Therefore, a film excellent in low-voltage driving can be formed. It is also possible to realize a self-poling phenomenon of aligning polarization directions immediately after forming a film by designing a film-forming method.

In a case where a ferroelectric thin film such as a PZT-based film is manufactured as a sensor element of a gyro sensor by using a sputtering method, although there is concern that a polarization state may be damaged due to a thermal treatment for soldering in a reflowing process after packaging the film, there is an internal bias in a film realizing a self-poling phenomenon, and therefore, it is advantageous that a polarization state not be damaged due to this thermal treatment.

In a case where a ferroelectric thin film such as a PZT-based film is manufactured by using a CSD method, the manufactured ferroelectric thin film has excellent reproducibility of properties or property uniformity in a wafer surface, from the viewpoints of properties of the formed film. In addition, since a vacuum state is not used in the CSD method, the equipment cost is significantly decreased, compared to that of the sputtering method. In order to realize such advantages, a PZT-based film having excellent temperature characteristics in the CSD without damaging a polarization state is obtained.

As described above, research regarding a self-poling phenomenon of a PZT-based film has been done and Non-Patent Document 1 discloses that a self-poling phenomenon is also realized in a PZT-based film in the CSD method. Non-Patent Document 1 discloses that a self-poling phenomenon is caused by a strain of a film due to an effect of strain due to inconsistency of lattices in substrate interfaces at a thin film level.

In addition, Patent Document 2 discloses a manufacturing method of a ferroelectric thin film of forming an orientation control layer in which crystal orientation is controlled to the (100) plane on a lower electrode which will be described later. Further, Patent Document 3 discloses a manufacturing method of a ferroelectric thin film of forming an orientation control layer in which crystal orientation is controlled to the (110) plane on a lower electrode which will be described later.

CITATION LIST

Patent Document

[Patent Document 1] Japanese Unexamined Patent Application, First Publication No. 2001-261338 (claim 1, and Table 1)
[Patent Document 2] Japanese Unexamined Patent Application, First Publication No. 2012-256850 (claims 1 to 3)
[Patent Document 3] Japanese Unexamined Patent Application, First Publication No. 2012-256851 (claims 1 to 3)

Non-Patent Document

[Non-Patent Document 1] A. L. Kholkin, K. G. Brooks, D. V. Taylor, S. Hiboux and N. Setter: Integrated Ferroelectrics, 1998, vol. 22, pp. 525-533

DISCLOSURE OF INVENTION

Technical Problem

However, in the raw material solution disclosed in Patent Document 1, generation of cracks on a film can be prevented to some extent by adding propylene glycol or a polymer, but it is still insufficient to prevent cracks on a film, and it is still necessary to form a film having a dense film structure and further prevent generation of cracks, in order to form a thick film having sufficient characteristics in practice.

According to the present invention, a first object is to provide a composition for forming a Mn-doped PZT-based piezoelectric film which can improve a piezoelectric constant of a piezoelectric film, decrease a permittivity, and form a piezoelectric film having excellent stability after a polarization process, and a Mn-doped PZT-based piezoelectric film formed by using this composition.

According to the present invention, a second object is to provide a composition for forming a Mn-doped PZT-based piezoelectric film which can obtain a dense and high-performance piezoelectric film without generating voids or cracks, even with a comparatively great coating thickness per single application, and realize crystallization in a single sintering, and a Mn-doped PZT-based piezoelectric film formed by using this composition.

Non-Patent Document 1 discloses that a self-poling phenomenon disappears in accordance with an increase in a film thickness of a PZT-based film when the film is formed by using the CSD method. Specifically, Non-Patent Document 1 discloses that polarization does not significantly change in a PZT film having a film thickness equal to or smaller than 0.7 μm, but when the film thickness exceeds 0.7 μm, an effect of strain is eliminated, and this leads to elimination of a self-poling phenomenon and an extremely small quantity of polarization. Thus, there were problems to be solved in order to manufacture a film realizing a self-poling phenomenon and having a film thickness equal to or greater than 0.8 μm which can be used in practice in the CSD method.

Therefore, according to the present invention, a third object is to provide a Mn-doped PZT-based piezoelectric film which is formed by using a CSD method, has a film thickness equal to or greater than 0.8 μm, has excellent stability after a polarization process, and prevents a decrease in piezoelectric properties.

Solution to Problem

In a first aspect of the present invention, there is provided a composition for forming a Mn-doped PZT-based piezoelectric film used for forming a PZT-based piezoelectric film formed of Mn-doped composite metal oxides, the composition including: PZT-based precursors containing metal atoms configuring the composite metal oxides; a diol; and polyvinylpyrrolidone, in which, when a metal atom ratio in the composition is shown as Pb:Mn:Zr:Ti and the total of Zr and Ti in a metal atom ratio is 1, the PZT-based precursors are contained so that Pb is satisfied to be from 1.00 to 1.20, Mn is satisfied to be equal to or greater than 0.002 and less than 0.05, Zr is satisfied to be from 0.40 to 0.55, Ti is satisfied to be from 0.45 to 0.60, a concentration of the PZT-based precursor in 100 mass % of the composition is from 17 mass % to 35 mass % in terms of an oxide concentration, a rate of diol in 100 mass % of the composition is from 16 mass % to 56 mass %, and a molar ratio of polyvinylpyrrolidone to 1 mole of the PZT-based precursor is 0.005 moles to 0.25 moles, in terms of monomers.

In a second aspect of the present invention, there is provided a Mn-doped PZT-based piezoelectric film formed of Mn-doped composite metal oxides, which is formed using the composition according to the first aspect by using a CSD method and represented by a general formula $Pb_zMn_xZr_yTi_{1-y}O_3$, in which, when the total mole number of Zr and Ti in the composite metal oxides is set as 1 mole, a molar ratio of Pb is in a range of 0.95 to 1.10, and a molar ratio of Mn is in a range equal to or greater than 0.002 and less than 0.05.

In a third aspect of the present invention, in the Mn-doped PZT-based piezoelectric film according to the second aspect of the present invention, an orientation degree of the (100) plane or the (001) plane obtained by X-ray diffraction is equal to or greater than 90%.

In a fourth aspect of the present invention, in the Mn-doped PZT-based piezoelectric film according to the second aspect of the present invention, when the total mole number of Zr and Ti in the composite metal oxides is set as 1 mole, a molar ratio of Mn is in a range of 0.01 to 0.045, the PZT-based piezoelectric film is preferentially crystal-oriented to the (100) plane or the (001) plane, and a film thickness is from 0.8 μm to 3 μm.

In a fifth aspect of the present invention, in the Mn-doped PZT-based piezoelectric film according to the fourth aspect of the present invention, an orientation degree of the (100) plane or the (001) plane obtained by X-ray diffraction is equal to or greater than 95%.

In a sixth aspect of the present invention, in the Mn-doped PZT-based piezoelectric film according to the fourth or fifth aspect of the present invention, deviation D of a hysteresis loop of polarization-electric field properties obtained by the following Formula (2) is at least 8.8 kV/cm.

$$D=E_c^+-[(E_c^++E_c^-)/2] \tag{2}$$

(Where, $E_c^+$ indicates an absolute value of a positive electric field value from 0 kV/cm when the polarization quantity is 0 μC/cm², and $E_c^-$ indicates an absolute value of a negative electric field value from 0 kV/cm when the polarization quantity is 0 μC/cm²).

The inventors have found that a PZT-based film can realize a sufficient self-poling phenomenon in practice, even when a film thickness is equal to or greater than 0.8 μm, by adding Mn to a PZT-based material and increasing a crystal-orientation degree to the (100) plane or the (001) plane of the film and achieved the present invention.

Advantageous Effects of Invention

According to the first aspect of the present invention, the composition is used for forming a PZT-based piezoelectric film formed of Mn-doped composite metal oxides, the composition containing: PZT-based precursors containing metal atoms configuring the composite metal oxides; a diol; and polyvinylpyrrolidone; and when a metal atom ratio in the composition is shown as Pb:Mn:Zr:Ti and the total of Zr and Ti in a metal atom ratio is 1, the PZT-based precursors are contained so that Pb is satisfied to be from 1.00 to 1.20, Mn is satisfied to be equal to or greater than 0.002 and less than 0.05, Zr is satisfied to be from 0.40 to 0.55, Ti is satisfied to be from 0.45 to 0.60. A concentration of the PZT-based precursor in 100 mass % of the composition is from 17 mass % to 35 mass % in terms of an oxide concentration, a rate of diol in 100 mass % of the composition is from 16 mass % to 56 mass %, and a molar ratio of polyvinylpyrrolidone to 1 mole of the PZT-based precursor is 0.005 moles to 0.25 moles, in terms of monomers. Accordingly, a piezoelectric film having a high piezoelectric constant, showing greater displacement, and having a low permittivity can be formed. Since a Mn-doped piezoelectric film in which orientation is controlled to the (100) plane or the (001) plane has polarization directions aligned upwardly immediately after being formed, it is possible to increase stability of polarization by forming a piezoelectric film in which orientation is controlled to the (100) plane or the (001) plane, using the composition. It is possible to prevent generation of cracks or voids even when forming a film having a film thickness equal to or greater than 150 nm to increase production efficiency.

The Mn-doped PZT-based piezoelectric film according to the second aspect of the present invention is a PZT-based piezoelectric film formed of Mn-doped composite metal oxides, which is formed using the composition of the present invention and represented by a general formula $Pb_zMn_xZr_yTi_{1-y}O_3$. When the total mole number of Zr and Ti in the composite metal oxides is set as 1 mole, a molar ratio of Pb is in a range of 0.95 to 1.10, and a molar ratio of Mn is in a range equal to or greater than 0.002 and less than 0.05 (x, y, and z in the general formula satisfy a relationship of $0.002 \leq x < 0.05$, $0.40 \leq y \leq 0.55$, and $0.95 \leq z \leq 1.10$). Thus, a piezoelectric film having a high piezoelectric constant, showing greater displacement, and having a low permittivity can be obtained. Therefore, more advantages are obtained in a case of using the film as a sensor or the like.

Since the Mn-doped PZT-based piezoelectric film according to the third aspect of the present invention is doped with Mn and has a high orientation degree to the (100) plane or the (001) plane, stability of polarization is extremely high.

In the Mn-doped PZT-based piezoelectric film according to the fourth aspect of the present invention, a self-poling phenomenon is realized by substituting some Ti and Zr which are B-site ions by Mn by adding Mn to a PZT material having a perovskite structure represented by $ABO_3$ containing Pb, Zr, and Ti. Accordingly, the film has excellent temperature stability of a polarization state, even when the film thickness is from 0.8 μm to 3 μm, and it is possible to prevent elimination of a polarization state due to a thermal treatment for soldering in a reflowing process after packaging the film. A first specific technical reason is because oxygen deficiency is caused as shown in the following Formula (3), and thus, a self-poling phenomenon is realized due to pinning of domain walls.

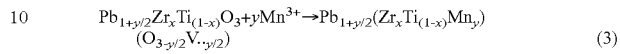

$$Pb_{1+y/2}Zr_xTi_{(1-x)}O_3 + yMn^{3+} \rightarrow Pb_{1+y/2}(Zr_xTi_{(1-x)}Mn_y)(O_{3-y/2}V_{\cdot\cdot y/2}) \quad (3)$$

For the second reason, when the doping of Mn is performed by using the CSD method, a composition gradient of Mn in which the concentration of Mn ions decreases in a film thickness direction from the lower surface side of the film towards the upper surface side of the film is formed, and a gradient of oxygen deficiency is also caused at the same time. It is assumed that the concentration gradient of oxygen deficiency causes a bias and a self-polishing phenomenon is more reliably realized.

For the third reason, since crystalline orientation is preferentially controlled to the (100) plane or the (001) plane, polarization directions are aligned upwardly immediately after the film is formed. Thus, a self-poling phenomenon is maintained and it is possible to increase stability of polarization. Even when the doping of Mn is performed, piezoelectric properties of a piezoelectric film are not deteriorated.

In the Mn-doped PZT-based piezoelectric film according to the fifth aspect of the present invention, since the orientation degree of the (100) plane or the (001) plane obtained by X-ray diffraction is equal to or greater than 95%, it is possible to further increase stability of polarization.

In the Mn-doped PZT-based piezoelectric film according to the sixth aspect of the present invention, deviation D of a hysteresis loop is obtained immediately after the film is formed, and the deviation D is at least 8.8 kV/cm. Accordingly, a film having a stable polarization state is obtained.

BEST MODE FOR CARRYING OUT THE INVENTION

Figure 1:
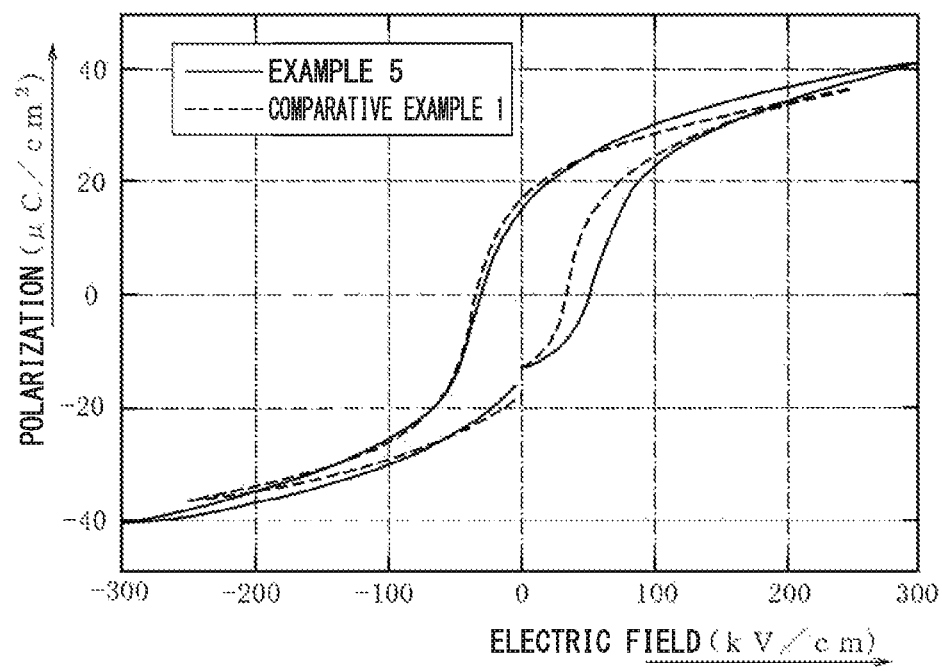
FIG. 1 is a diagram showing hysteresis curves of piezoelectric films of Example A5 and Comparative Example A1.

Next, an embodiment for realizing the present invention will be described with reference to the drawings.

[First Embodiment]
[Composition for Forming Mn-Doped PZT-Based Piezoelectric Film]

A composition of the first embodiment is used for forming a Mn-doped PZT-based piezoelectric film, and this Mn-doped PZT-based piezoelectric film has a composition represented by a general formula $Pb_zMn_xZr_yTi_{1-y}O_3$ in which Mn elements are added to Pb-containing composite metal oxides having a perovskite structure such as lead zirconate titanate (PZT). PZT-based precursors containing metal atoms configuring the composite metal oxides; a diol; and polyvinylpyrrolidone are contained in this composition.

A PZT-based precursor contained in a composition is a raw material for configuring the composite metal oxides in the formed piezoelectric film, and is contained so that each metal atom satisfies a desired metal atom ratio. Specifically, the PZT-based precursors are contained so that the metal atom ratio (Pb:Mn:Zr:Ti) in the composition satisfies (1.00 to 1.20):(0.002 to 0.05):(0.40 to 0.55):(0.45 to 0.60) and the total of metal atom ratio of Zr and Ti is 1. Accordingly, in the formed piezoelectric film, it is possible to control the composition to a desired composition in which x, y, and z in the general formula satisfy a relationship of $0.002 \leq x < 0.05$, $0.40 \leq y \leq 0.55$, and $0.95 \leq z \leq 1.10$.

That is, when the metal atom ratio in the composition is shown as Pb:Mn:Zr:Ti, Pb is satisfied to be from 1.00 to 1.20, Mn is satisfied to be equal to or greater than 0.002 and less than 0.05, Zr is satisfied to be from 0.40 to 0.55, and Ti is satisfied to be from 0.45 to 0.60.

In a case of a PZT film which is not doped with Mn and is formed by a wet coating method such as a sol-gel method, piezoelectric properties are not exhibited, immediately after a film is formed. In contrast, in a film which is doped with Mn and is strongly oriented to the (100) plane or (001) plane, a film in which the hysteresis is shifted to a positive side and polarization directions of the entire film are aligned upwardly immediately after being formed is obtained. Since such a film has excellent stability of polarization due to an imprint phenomenon of the hysteresis and low permittivity and dielectric loss (tan δ), the film is more easily formed as a film having preferred properties as a piezoelectric material.

As a PZT-based precursor, a compound in which organic groups are bonded with each metal atom such as Pb, Mn, Zr, and Ti through oxygen or nitrogen atoms thereof is preferably used. For example, one or more kinds selected from the group consisting of metal alkoxides, a metal diol complex, a metal triol complex, metal carboxylate, a metal β-diketonate complex, a metal β-diketoester complex, a metal β-iminoketo complex, and a metal amino complex are used. The particularly preferable compound is metal alkoxides, a partial hydrolyzate thereof, or organic acid salt.

Specifically, examples of the Pb compound include an acetic acid salt such as lead acetate: $Pb(OAc)_2$, or alkoxides such as lead diisopropoxide: $Pb(OiPr)_2$. Examples of the Mn compound include an organic acid salt such as manganese 2-ethylhexanoate, manganese naphthenate, or manganese acetate, or a metal β-diketonate complex such as acetylacetone manganese. Examples of the Ti compound include alkoxides such as titanium tetraethoxide: $Ti(OEt)_4$, titanium tetraisopropoxide: $Ti(OiPr)_4$, titanium tetra-n-butoxide: $Ti(OnBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. In addition, examples of the Zr compound include zirconium tetraethoxide: $Zr(OEt)_4$, zirconium tetraisopropoxide: $Zr(OiPr)_4$, zirconium tetra-n-butoxide: $Zr(OnBu)_4$, zirconium tetraisobutoxide: $Zr(OiBu)_4$, zirconium tetra t-butoxide: $Zr(OtBu)_4$, and zirconium-dimethoxy diisopropoxide: $Zr(OMe)_2(OiPr)_2$. The metal alkoxide may be used as it is, but a partial hydrolyzate thereof may be used in order to promote decomposition.

These PZT-based precursors, that is, the Pb compound, the Mn compound, the Ti compound, and the Zr compound described above are contained in a composition so as to have the desired metal atom ratio described above. Here, the metal atom ratio of Mn in the composition is controlled so as to fall in the range described above, because, when the metal atom ratio of Mn in the composition is less than the lower limit value, x in the general formula showing the film composition after the film is formed is less than the lower limit value, when the metal atom ratio thereof is an extremely slight amount which is close to zero, a piezoelectric constant may be slightly improved, but a dielectric constant is not sufficiently decreased, and when the metal atom ratio thereof is close to the lower limit, a dielectric constant may be slightly decreased, but a piezoelectric constant may be improved. In contrast, when the metal atom ratio of Mn in the composition exceeds the upper limit value, x in the general formula showing the film composition after the film is formed exceeds the upper limit value and a dielectric constant of a piezoelectric film may not be sufficiently decreased. The metal atom ratio of Zr and Ti in the composition are controlled so as to fall in the range described above, because, when the metal atom ratio of Zr and Ti in the composition are beyond the range described above, y in the general formula showing the film composition after the film is formed is beyond the desired range described above and a piezoelectric constant of a piezoelectric film may not be sufficiently improved. The metal atom ratio of Pb in the composition is controlled so as to fall in the range described above, because, when the metal atom ratio of Pb in the composition is less than the lower limit value, z in the general formula showing the film composition after the film is formed is less than the lower limit value, a large amount of pyrochlore phases is contained in the film and electrical properties such as piezoelectric properties are significantly deteriorated. In contrast, when the metal atom ratio of Pb in the composition is greater than the upper limit value of the range described above, z in the general formula showing the film composition after the film is formed is greater than the upper limit value, a large amount of PbO remains in the sintered film and electrical reliability of the film is deteriorated due to an increase in leakage current. That is, an excessive amount of lead easily remains in the film and leakage properties or insulating properties are deteriorated. It is preferable that the metal atom ratio (Pb:Mn:Zr:Ti) in the composition satisfy (1.05 to 1.15):(0.005 to 0.03):(0.45 to 0.55):(0.45 to 0.55) and the total of Zr and Ti in a metal atom ratio be 1. In this specification, a degree (high or low) of a piezoelectric constant means a degree (high and low) of an absolute value of a piezoelectric constant.

A concentration of the PZT-based precursor in 100 mass % of a composition is 17 mass % to 35 mass %, in terms of an oxide concentration. The concentration of the PZT-based precursor is limited to be in the range described above, because a sufficient film thickness is hardly obtained when the concentration thereof is less than the lower limit value, and cracks are easily generated when the concentration thereof exceeds the upper limit value. Among these, the concentration of the PZT-based precursor in 100 mass % of a composition is preferably from 20 mass % to 25 mass %, in terms of an oxide concentration. The oxide concentration of the concentration of the PZT-based precursor in the composition is a concentration of metal oxides in 100 mass % of a composition which is calculated by assuming that all of the metal atoms contained in a composition are desired oxides.

A diol contained in the composition is component which is a solvent of a composition. Specific examples of diols include propylene glycol, ethylene glycol, and 1,3-propanediol. Among these, propylene glycol or ethylene glycol is particularly preferable. When the diol is set as a compulsory solvent component, it is possible to increase storage stability of a composition.

A rate of the diols in 100 mass % of the composition is preferably from 16 mass % to 56 mass %. The rate of the diols is limited to be in the range described above, because precipitates may be generated when the rate thereof is less than the lower limit value, and on the other hand, voids (micropores) are easily generated at the time of obtaining a thick film when the rate thereof exceeds the upper limit value. Among these, the rate of the diols is preferably from 28 mass % to 42 mass %.

Examples of other solvents include carboxylic acid, alcohol (for example, ethanol or 1-butanol, or polyalcohol other than diol), ester, ketones (for example, acetone or methyl ethyl ketone), ethers (for example, dimethyl ether or diethyl ether), cycloalkanes (for example, cyclohexane or cyclohexanol), aromatics (for example, benzene, toluene, or xylene), and other tetrahydrofurans, and a mixed solvent obtained by mixing one kind or two or more kinds of these with a diol can also be used.

Specifically, as carboxylic acid, n-butyric acid, α-methyl butyrate, i-valeric acid, 2-ethylbutyrate, 2,2-dimethylbutyrate, 3,3-dimethylbutyrate, 2,3-dimethylbutyrate, 3-methylpentanoate, 4-methylpentanoate, 2-ethylpentanoate, 3-ethylpentanoate, 2,2-dimethylpentanoate, 3,3-dimethylpentanoate, 2,3-dimethylpentanoate, 2-ethylhexanoate, or 3-ethylhexanoate are preferably used.

As ester, ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate is preferably used, and as alcohol, 1-propanol, 2-propanol, 1-butanol, 2-butanol, iso-butyl alcohol, 1-pentanol, 2-pentanol, 2-methyl-2-pentanol, or 2-methoxyethanol is preferably used.

In addition, the composition of the first embodiment contains polyvinylpyrrolidone (PVP), which is a polymer compound. Polyvinylpyrrolidone is used for adjusting liquid viscosity in a composition and has a great effect of preventing cracks. Particularly, polyvinylpyrrolidone is used for adjusting relative viscosity determined by using a k value. The k value here is a viscosity property value relating to a molecular weight, and is a value calculated by applying a relative viscosity value (25° C.) measured by using a capillary viscometer in the following Fikentscher's formula.

$$k \text{ value} = (1.5 \log \eta rel - 1)/(0.15 + 0.003c) + (300c \log \eta rel + (c + 1.5c \log \eta rel)^2)^{1/2}/(0.15c + 0.003c^2)$$

In the formula, "ηrel" represents a relative viscosity of polyvinylpyrrolidone aqueous solution with respect to water and "c" represents a polyvinylpyrrolidone concentration (mass %) in the polyvinylpyrrolidone aqueous solution.

The k value of polyvinylpyrrolidone contained in the composition of the first embodiment is preferably from 30 to 90. In order to form a thick piezoelectric film, it is necessary to have sufficient viscosity in order that a coated film (gel film) maintains a thickness thereof at the time of coating a substrate or the like with a composition, but, when the k value is less than the lower limit value, sufficient viscosity is hardly obtained. On the other hand, when the k value exceeds the upper limit value, viscosity becomes excessively high and the composition is difficult to be uniformly applied.

A molar ratio of polyvinylpyrrolidone to 1 mole of the PZT-based precursor is 0.005 moles to 0.25 moles, in terms of monomers. The molar ratio of polyvinylpyrrolidone is limited to the range described above, because cracks are easily generated when the molar ratio thereof is less than the lower limit value, and voids are easily generated when the molar ratio thereof exceeds the upper limit value. Among these, the molar ratio of polyvinylpyrrolidone to 1 mole of the PZT-based precursor is preferably 0.025 moles to 0.075 moles, in terms of monomers. Polyvinylpyrrolidone (PVP) has a high decomposition temperature and great affinity with the PZT-based precursor. Therefore, polyvinylpyrrolidone is difficult to be removed from the film and easily causes voids. Accordingly, the amount added is desirable to be as small as possible. In the composition of the first embodiment, the precursor is suitably subjected to hydrolysis and organic materials are easily removed from the film. Accordingly, the amount added can be reduced to a comparatively small amount.

Here, a value in terms of monomer is a value obtained by converting a molecular weight of a monomer using the molecular weight of the monomer configuring a polymer as a reference (1 mole).

It is preferable that linear monoalcohol having 6 to 12 carbon atoms be added into the composition of the first embodiment, and a rate thereof added be preferably from 0.6 mass % to 10 mass % in 100 mass % of the composition. When an appropriate amount of linear monoalcohol is contained in the composition, a gel film which can effectively release organic materials to the outside of the film can be formed at the time of calcination. As a result, a dense and high-performance Mn-doped PZT-based piezoelectric film is obtained, even when the film thickness exceeds 100 nm. The number of carbon atoms of the linear monoalcohol is preferably from 6 to 12, because a boiling point is not sufficiently high and the film may not be sufficiently densified when the number of carbon atoms is less than the lower limit value. On the other hand, when the number of carbon atoms exceeds the upper limit value, the film can be densified, but solubility to a sol-gel solution is low, it is difficult to dissolve a sufficient amount of the linear monoalcohol, and viscosity of the solution excessively increases. Thus, uniform coating may not be performed due to generation of striation (stria or stripe). The number of carbons of the linear monoalcohol is more preferably from 7 to 9. The rate of the linear monoalcohol in 100 mass % of the composition is preferably in the range described above, because, when the rate thereof is lower than the lower limit value, a sufficient clearance is not obtained in the film and organic materials in the film cannot be effectively removed during the process. Thus, the film may not be sufficiently densified. On the other hand, when the rate thereof exceeds the upper limit value, the drying of the film is delayed and a certain period of time is taken until the drying is completed. Thus, the film thickness may become thin. The rate of the linear monoalcohol in 100 mass % of the composition is more preferably from 1 mass % to 3 mass %. In addition, linear monoalcohol having 6 carbon atoms is 1-hexanol, linear monoalcohol having 7 carbon atoms is 1-heptanol, linear monoalcohol having 8 carbon atoms is 1-octanol, and linear monoalcohol having 9 carbon atoms is 1-nonanol. Further, linear monoalcohol having 10 carbon atoms is 1-decanol, linear monoalcohol having 11 carbon atoms is 1-undecanol, and linear monoalcohol having 12 carbon atoms is 1-dodecanol.

In addition to the components described above, as a stabilizer, if necessary, β-diketones (for example, acetylacetone, heptafluoro butanoylpivaloyl methane, dipivaloylmethane, trifluoroacetylacetone, benzoyl acetone, and the like), β-ketone acids (for example, acetoacetic acid, propionyl acetate, benzoyl acetate, and the like), β-ketoesters (for example, lower alkylesters such as methyl, propyl, or butyl of the keton acids described above), oxy acids (for example, lactic acid, glycolic acid, α-oxy butyrate, salicylic acid, and the like), lower alkylesters of the oxy acids, oxyketones (for example, diacetone alcohol, acetone, and the like), diol, triol, higher carboxylic acid, alkanolamines (for example, diethanolamine, triethanolamine, monoethanolamine, and the like), or polyamine may be added in an amount of approximately 0.2 to 3 in terms of a value of (molecular number of stabilizer)/(metal atom number). Among these, acetylacetone of β-diketones is preferable as the stabilizer.

[Manufacturing Method of Composition for Forming Mn-Doped PZT-Based Piezoelectric Film]

A manufacturing method the composition for forming a Mn-doped PZT-based piezoelectric film of the first embodiment will be described. First, the PZT-based precursors such as the Pb compound described above are prepared and these are weighed to have a rate so as to have the desired metal atom ratio described above. The weighed PZT-based precursor described above and a diol are put into a reaction vessel and mixed with each other, and refluxed and reacted with each other preferably in a nitrogen atmosphere at a temperature of 130° C. to 175° C. for 0.5 hours to 3 hours, and thus, synthetic liquid is prepared. After refluxing, it is preferable to perform desolventizing by using a method of atmospheric distillation or vacuum distillation. In a case of adding the stabilizer such as acetylacetone, the stabilizer is put and incorporated therein when putting the PZT-based precursor and the diol into a reaction vessel. Alternatively, it is preferable to add these to the synthetic liquid after the desolventizing, and perform refluxing in the nitrogen atmosphere at a temperature of 130° C. to 175° C. for 0.5 hours to 5 hours. After that, the synthetic liquid is cooled to room temperature (approximately 25° C.) by performing natural cooling at room temperature. After the cooling, a concentration of the PZT-based precursor contained in the synthetic liquid is adjusted to a desired concentration by adding solvents other than diol. It is preferable that the amounts of the PZT-based precursor and diol used be adjusted so that the concentration of the PZT-based precursor in 100 mass % of the composition finally obtained becomes 17 mass % to 35 mass % in terms of an oxide concentration and the concentration of diol becomes 16 mass % to 56 mass %.

The linear monoalcohol is added to the cooled synthetic liquid to prepare a sol-gel solution. In a case of adding the linear monoalcohol, the linear monoalcohol is also added to prepare a sol-gel solution when adding solvents other than the diol described above to the cooled synthetic liquid. Then, this sol-gel solution is refluxed again in a predetermined atmosphere, for example, a nitrogen atmosphere, at a temperature of 100° C. to 175° C. for 0.5 hours to 10 hours.

Polyvinylpyrrolidone in which a molar ratio of the polyvinylpyrrolidone to 1 mole of the PZT-based precursor satisfies 0.005 moles to 0.25 moles in terms of monomers is added to the sol-gel solution, and the polyvinylpyrrolidone is stirred to be evenly dispersed. Accordingly, a composition for forming the Mn-doped PZT-based piezoelectric film of the first embodiment is obtained.

After preparing the composition, particles are removed by performing a filtering process or the like, and the number of particles having a particle size equal to or greater than 0.5 μm (particularly, equal to or greater than 0.3 μm, and more particularly, equal to or greater than 0.2 μm) is preferably equal to or less than 50 per 1 milliliter of the composition. When the number of particles in the composition having a particle size equal to or greater than 0.5 μm exceeds 50 per 1 milliliter of the composition, long-term storage stability is deteriorated. It is preferable that the number of particles in the composition having a particle size equal to or greater than 0.5 μm be as small as possible, and it is particularly preferable that the number thereof be equal to or smaller than 30 per 1 milliliter of the composition.

A method of processing the composition in which the number of particles is adjusted particles to be in the range described above is not particularly limited, and the following methods are used, for example. A first method is a filtering method of performing a force-feed with a syringe by using a commercially available membrane filter having a hole diameter of 0.2 μm. A second method is a pressure-filtering method performed by combining a commercially available membrane filter having a hole diameter of 0.05 μm and a pressure tank with each other. A third method is a circulating and filtering method performed by combining the filter used in the second method and a liquid circulating bath with each other.

In any methods, particle capture rates obtained by using a filter are different depending on the force-feed pressure of the composition. It is generally known that, as the pressure is reduced, the capture rate increases. Particularly, in the first method or the second method, it is preferable that the composition be caused to extremely slowly pass through the filter at low pressure, in order to realize the condition in which the number of particles having a particle size equal to or greater than 0.5 μm is equal to or smaller than 50 per 1 milliliter of the composition.

[Forming Method of Mn-Doped PZT-Based Piezoelectric Film]

Next, a method of forming the Mn-doped PZT-based piezoelectric film of the first embodiment will be described. This forming method is a method of forming a piezoelectric film by using a sol-gel method and the composition for forming a Mn-doped PZT-based piezoelectric film described above is used as a raw material solution.

First, the composition for forming a Mn-doped PZT-based piezoelectric film described above is coated on a substrate and a coated film (gel film) having a predetermined thickness is formed. The coating method is not particularly limited, and spin coating, dip coating, a liquid source misted chemical deposition (LSMCD) method, or an electrostatic spray method is used. As the substrate where a piezoelectric film is formed, a silicon substrate where a lower electrode is formed or a heat-resistant substrate such as a sapphire substrate is used. A lower electrode formed on a substrate is formed by using a material having conductivity and not reacting with a piezoelectric film, such as Pt, $TiO_x$, Ir, or Ru. For example, the lower electrode can have a double-layered structure of a $TiO_x$ film and a Pt film, in this order, from the substrate side. As a specific example of the $TiO_x$ film, a $TiO_2$ film is used. In a case of using a silicon substrate as a substrate, a $SiO_2$ film can be formed on a surface of this substrate.

It is desired to form an orientation-controlled film in which crystalline orientation is preferentially controlled to the (100) plane or (001) plane on the lower electrode where a piezoelectric film is to be formed before forming the piezoelectric film. This is because a film having aligned polarization directions immediately after being formed can be formed by strongly orienting the Mn-doped PZT-based piezoelectric film to the (100) plane or (001) plane. Examples of the orientation-controlled film include a LNO film ($LaNiO_3$ film), a PZT film, or a $SrTiO_3$ film in which crystalline orientation is preferentially controlled to the (100) plane or (001) plane.

After forming a coating film on a substrate, this coating film is calcinated, sintered, and crystallized. The calcination is performed under predetermined conditions by using a hot plate or a rapid heating process (RTA). The calcination is performed in order to remove a solvent and convert the metal compound into a composite metal oxide by pyrolysis or hydrolysis, and therefore, the calcination is desirably performed in air, in an oxidation atmosphere, or in an atmosphere containing water vapor. Even when the heating is performed in the air, moisture necessary for hydrolysis is sufficiently ensured with moisture in the air. Since a low-boiling-point solvent or absorbed water molecules are particularly removed before the calcinations, low-temperature heating (drying) may be performed by using a hot plate at a temperature of 70° C. to 90° C. for 0.5 minutes to 5 minutes.

The calcination is performed by holding the temperature preferably at 250° C. to 300° C. for 2 minutes to 5 minutes, but it is preferable to perform the calcination by performing two-stage calcination by changing a heating holding temperature, in order to sufficiently remove a solvent or the like to further increase an effect of preventing voids or cracks or in order to promote densifying of a film structure. In a case of performing the two-stage calcination, a first stage is calcination in which the temperature is held at 250° C. to 300° C. for 3 minutes to 10 minutes, and a second stage is calcination in which the temperature is held at 400° C. to 500° C. for 3 minutes to 10 minutes.

Here, the calcination temperature in the first stage is preferably in a range of 250° C. to 300° C., because pyrolysis of a precursor is insufficient and cracks are easily generated when the calcination temperature is lower than the lower limit value. On the other hand, when the calcination temperature exceeds the upper limit value, the precursor material on the upper portion of the substrate is decomposed before the precursor material in the vicinity of the substrate is completely decomposed, the organic materials remain around the substrate of the film, and the voids are easily generated. The calcination time in the first stage is preferably from 3 minutes to 10 minutes, because the decomposition of the precursor material does not sufficiently proceed when the calcination time is shorter than the lower limit value, and the process time is increased and productivity may be decreased when the calcination time exceeds the upper limit value. The calcination temperature in the second stage is preferably in a range of 400° C. to 450° C., because residual organic materials remaining in the precursor material are not completely removed and the film may not be sufficiently densified when the calcination temperature is lower than the lower limit value. On the other hand, when the calcination temperature exceeds the upper limit value, it may be difficult to control orientation properties due to promotion of the crystallization. The calcination time in the second stage is preferably from 3 minutes to 10 minutes, because the residual organic materials are not sufficiently removed, and peeling or cracks of the film may be easily generated due to generation of strong stress at the time of crystallization when the calcination time is shorter than the lower limit value. On the other hand, when the calcination time exceeds the upper limit value, the process time is increased and productivity may be decreased.

In a step from the application of the composition to the calcination, sintering can be finally collectively performed by repeating a plurality of steps up to the calcination so as to have a desired film thickness. When the composition of the first embodiment described above is used as the raw material solution, stress derived from film contraction generated at the time of forming a film can be prevented. Thus, a thick film having a thickness of approximately several hundreds of nm can be formed by a single coating step without generating voids or cracks. Accordingly, the number of steps to be repeated described above can be decreased.

The sintering is a step of sintering the coating film after the calcination at a temperature equal to or higher than a crystallization temperature to perform crystallization, and a piezoelectric film is obtained by performing this step. As a sintering atmosphere of this crystallization step, $O_2$, $N_2$, Ar, $N_2O$, or $H_2$, or mixed gas thereof is suitable. The sintering is performed at 600° C. to 700° C. for approximately 1 minute to 5 minutes. The sintering may be performed by using a rapid heating process (RTA). In a case of performing the sintering by using a rapid heating process (RTA), a rate of temperature rise thereof is preferably from 2.5° C./sec to 100° C./sec.

[Mn-Doped PZT-Based Piezoelectric Film]

By performing the steps described above, the Mn-doped PZT-based piezoelectric film is obtained.

In the Mn-doped PZT-based piezoelectric film of the first embodiment, when the total mole number of Zr and Ti in the Mn-doped composite metal oxides represented by a general formula $Pb_zMn_xZr_yTi_{1-y}O_3$, is set as 1 mole, a molar ratio of Pb is in a range of 0.95 to 1.10 and a molar ratio of Mn is in a range of 0.002 and 0.05. More specifically, when the total mole number of Zr and Ti in the Mn-doped composite metal oxides is set as 1 mole, a molar ratio of Pb is in a range of 1.00 to 1.09 and a molar ratio of Mn is in a range of 0.01 and 0.03.

Figure 2:
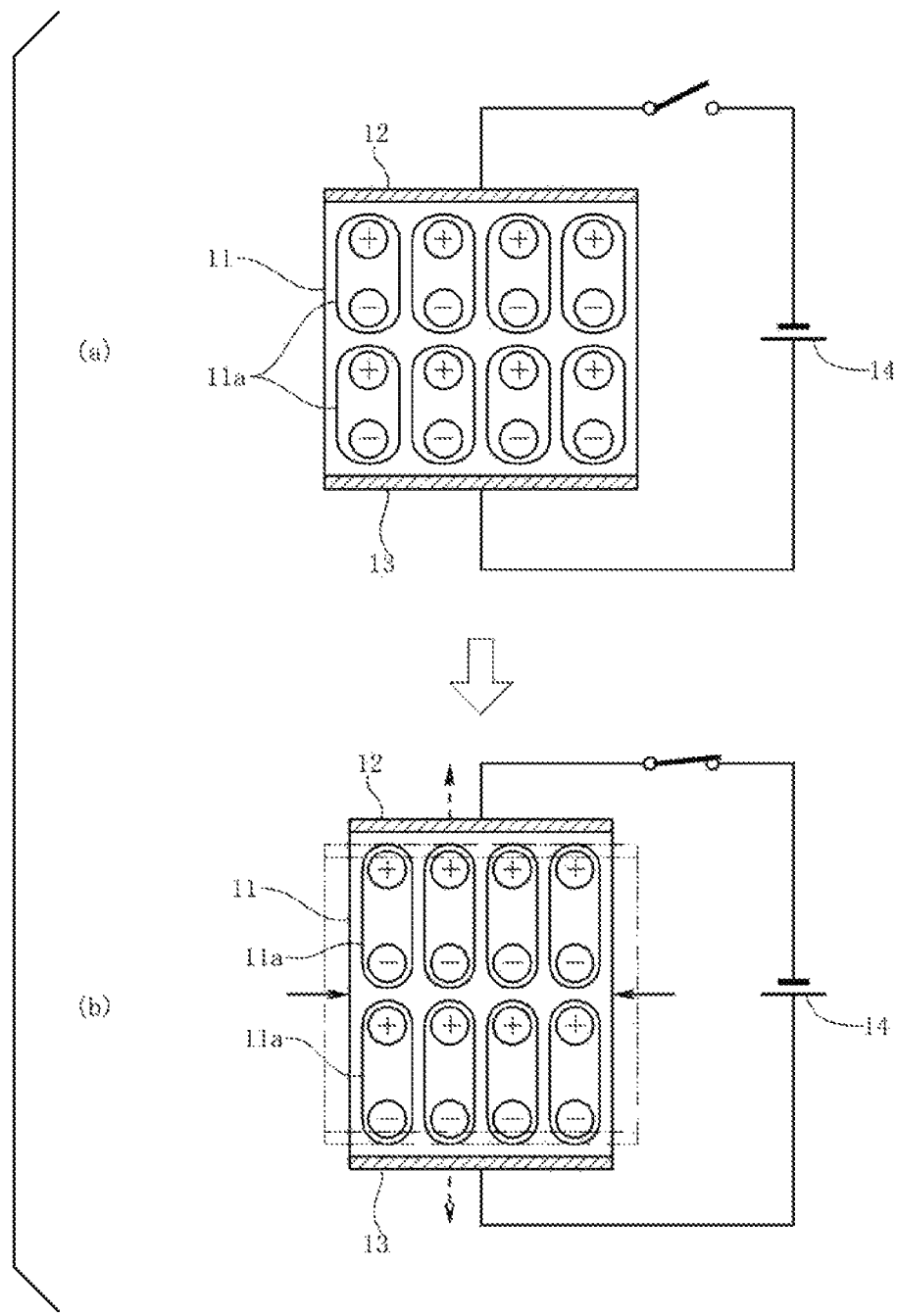
FIG. 2 is a schematic view showing behaviors of a piezoelectric film when a voltage is applied to a piezoelectric film manufactured by using a composition for forming a Mn-doped PZT-based piezoelectric film of the embodiments (the first embodiment and the second embodiment) of the present invention.

It is possible to improve a piezoelectric constant of this piezoelectric film by performing doping with Mn, and thus, it is possible to obtain greater displacement and to decrease a permittivity. Accordingly, in a case of using this piezoelectric film as a sensor, the advantages are increased. One main reason thereof is considered to be because Mn added is substituted with Zr or Ti and causes oxygen deficiency. As shown in FIG. 1, a hysteresis curve is greatly shifted to a positive side and polarization directions are aligned upwardly immediately after the film is formed. Since depolarization due to thermal treatment such as a reflowing process hardly occurs and excellent stability of polarization is obtained after the polarization process, it is possible to stably operate the film as a device by applying an electric field to a negative side. For these reasons, this film can be used as a piezoelectric material. Specifically, as shown in FIG. 2, a state in which each molecule 11a in a piezoelectric film 11 is polarized is maintained before applying a DC voltage 14 between electrodes 12 and 13 disposed on both surfaces of the piezoelectric film 11 (FIG. 2(a)). As shown in FIG. 2(b), when a voltage is applied between the electrodes 12 and 13 disposed on both surfaces of the piezoelectric film 11, the piezoelectric film 11 elongates in a direction where the voltage is applied, and when this voltage is set as zero, the piezoelectric film 11 elongated in a direction where the voltage is applied, is contracted and returns to the original state (FIG. 2(a)), and thus, the piezoelectric film can be used as a piezoelectric element or the like. In this embodiment, a piezoelectric film having a property of elongating in a direction where the voltage is applied is used, but a piezoelectric film having a property of elongating in a direction orthogonal to a direction where the voltage is applied may be used.

In the Mn-doped PZT-based piezoelectric film of the first embodiment, an orientation degree of the (100) plane or (001) plane obtained by X-ray diffraction is equal to or greater than 90%. The upper limit value of the orientation degree can be set as 100%.

In a case where this Mn-doped PZT-based piezoelectric film of the first embodiment is used as a gyro sensor, a film thickness formed by single application can be set to be great and thus, the number of manufacturing steps can be decreased. Although this piezoelectric film is a thick film comparatively simply obtained with the small number of steps at the time of forming the film, cracks are extremely slight and a dense film structure is obtained, and thus, electric properties are extremely excellent. Since the film is formed by performing the sintering at a high temperature of 600° C. to 700° C., piezoelectric properties are not lost, even when a device using the piezoelectric film is exposed to a high temperature for reflow-type soldering. Accordingly, the Mn-doped PZT-based piezoelectric film of the first embodiment can be suitably used as a configuration material of a composite electronic component such as a piezoelectric element, an IPD, or a pyroelectric element.

[Second Embodiment]

[Composition for Forming Mn-Doped PZT-Based Piezoelectric Film]

A composition for forming a Mn-doped PZT-based piezoelectric film of a second embodiment is a composition for forming a piezoelectric film in which Mn elements are added (doping) to Pb-containing composite metal oxides having a perovskite structure such as lead zirconate titanate (PZT). The composition for forming a Mn-doped PZT-based piezoelectric film of the second embodiment contains a PZT-based precursor, a diol as a main solvent, and polyvinylpyrrolidone as a liquid viscosity adjuster. A PZT-based precursor contained in the composition is a raw material for configuring the composite metal oxides in the formed piezoelectric film, and when the total mole number of Zr and Ti in the composite metal oxides is set as 1 mole, a molar ratio of Mn is in a range of 0.01 to 0.045. When the molar ratio of Mn is less than 0.01, an imprint phenomenon is not realized in the formed PZT-based piezoelectric film and a self-poling phenomenon is not realized. When the molar ratio thereof exceeds 0.045, piezoelectric properties of the piezoelectric film are deteriorated.

More specifically, in a case where the composition for forming a PZT-based piezoelectric film is a composition for forming a PMnZT piezoelectric film, the PZT-based precursors are contained so that the metal atom ratio (Pb:Mn:Zr:Ti) in the composition satisfies (1.00 to 1.20):(0.01 to 0.045):(0.40 to 0.55):(0.45 to 0.60) and the total of metal atom ratio of Zr and Ti is 1. Accordingly, in the formed piezoelectric film, when a general formula of the PZT-based piezoelectric film is represented by $PbMn_xZr_yTi_{1-y}O_3$, it is possible to control the composition to a desired composition in which x, y, and z in the general formula satisfy a relationship of $0.01 \leq x < 0.045$, $0.40 \leq y \leq 0.55$, and $0.95 \leq z \leq 1.10$.

In a case where the composition for forming a Mn-doped PZT-based piezoelectric film is a composition for forming a PMnNbZT piezoelectric film, the PZT-based precursors are contained so that the metal atom ratio (Pb:Mn:Nb:Zr:Ti) in the composition satisfies (1.00 to 1.20):(0.01 to 0.045):(0.01 to 0.045):(0.40 to 0.55):(0.45 to 0.60) and the total of metal atom ratio of Zr, Ti, Mn, and Nb is 1. Accordingly, in the formed piezoelectric film, when a general formula of the PNbZT-based piezoelectric film is represented by $Pb_zMn_xNb_{1-x}Zr_yTi_{1-y}O_3$, it is possible to control the composition to a desired composition in which x, y, and z in the general formula satisfy a relationship of $0.01 \leq x < 0.045$, $0.40 \leq y \leq 0.55$, and $0.95 \leq z \leq 1.10$.

In a case where the composition for forming a PZT-based piezoelectric film is a composition for forming a PMnLaZT piezoelectric film, the PZT-based precursors are contained so that the metal atom ratio (Pb:La:Mn:Zr:Ti) in the composition satisfies (1.00 to 1.20):(0.01 to 0.05):(0.01 to 0.045):(0.40 to 0.55):(0.45 to 0.60) and the total of metal atom ratio of Pb and La is 1. Accordingly, in the formed piezoelectric film, when a general formula of the PLaZT-based piezoelectric film is represented by $Pb_zLa_tMn_xZr_yTi_{1-y}O_3$, it is possible to control the composition to a desired composition in which x, y, z, and t in the general formula satisfy a relationship of $0.01 \leq x < 0.045$, $0.40 \leq y \leq 0.55$, $0.01 \leq y \leq 0.05$, and $1.00 \leq z \leq 1.20$.

As a PZT-based precursor, a compound in which organic groups are bonded with each metal atom such as Pb, Mn, Zr, and Ti, each metal atom such as Pb Mn, Nb, Zr, and Ti, or each metal atom such as Pb, Mn, La, Zr, and Ti through oxygen or nitrogen atoms thereof is preferably used. For example, one kind or two or more kinds selected from the group consisting of metal alkoxides, a metal diol complex, a metal triol complex, metal carboxylate, a metal β-diketonate complex, a metal β-diketoester complex, a metal β-iminoketo complex, and a metal amino complex are used. The particularly preferable compound is metal alkoxides, a partial hydrolyzate thereof, or organic acid salt.

As the Pb compound, the same Pb compound as that in the first embodiment is used. As the Mn compound, the same Mn compound as that in the first embodiment is used. As the Ti compound, the same Ti compound as that in the first embodiment is used. As the Zr compound, the same Zr compound as that in the first embodiment is used.

Examples of the Nb compound include alkoxides such as niobium pentaethoxide or niobium 2-ethylhexanoate or organic acid salt, and examples of the La compound include an organic acid salt such as lanthanum acetate 1.5 hydrate. The metal alkoxide may be used as it is, but a partial hydrolyzate thereof may be used in order to promote decomposition.

The Pb compound, the Mn compound, the Ti compound, the Zr compound, or the Nb compound or the La compound described above are contained in the composition at a rate so as to have the desired metal atom ratio described above. Here, the metal atom ratio of Mn in the composition is controlled so as to fall in the range described above, because, when the metal atom ratio of Mn in the composition is less than the lower limit value, x in the general formula showing the film composition after the film is formed is less than the lower limit value, and as described above, an imprint phenomenon is not realized in the formed PZT-based piezoelectric film and a self-poling phenomenon is not realized. On the other hand, when the metal atom ratio of Mn in the composition is greater than the upper limit value, x in the general formula showing the film composition after the film is formed exceeds the upper limit value and piezoelectric properties of the piezoelectric film are deteriorated as described above.

The metal atom ratio of Zr and Ti in the composition are controlled so as to fall in the range described above, because, when the metal atom ratio of Zr and Ti in the composition are beyond the range described above, y in the general formula showing the film composition after the film is formed is beyond the desired range described above and a piezoelectric constant of a piezoelectric film may not be sufficiently improved. The metal atom ratio of Pb in the composition is controlled so as to fall in the range described above, because, when the metal atom ratio of Pb in the composition is less than the lower limit value, z in the general formula showing the film composition after the film is formed is less than the lower limit value, a large amount of pyrochlore phases is contained in the film and electrical properties such as piezoelectric properties are significantly deteriorated. In contrast, when the metal atom ratio of Pb in the composition is greater than the upper limit value of the range described above, z in the general formula showing the film composition after the film is formed is greater than the upper limit value, a large amount of PbO remains in the sintered film and electrical reliability of the film is deteriorated due to an increase in leakage current. That is, an excessive amount of lead easily remains in the film and leakage properties or insulating properties are deteriorated.

In a case where the composition for forming a PZT-based piezoelectric film is a composition for forming a PZT piezoelectric film, the metal atom ratio (Pb:Mn:Zr:Ti) in the composition satisfies (1.05 to 1.15):(0.02 to 0.042):(0.45 to 0.55):(0.45 to 0.55) among the range described above and the total of metal atom ratio of Zr and Ti is 1.

In a case where the composition for forming a PZT-based piezoelectric film is a composition for forming a PNbZT-based piezoelectric film, it is preferable that the metal atom ratio (Pb:Mn:Nb:Zr:Ti) in the composition satisfy (1.03 to 1.10):(0.015 to 0.03):(0.015 to 0.03):(0.45 to 0.54):(0.46 to 0.56) and the total of metal atom ratio of Zr, Ti, Mn, and Nb be 1.

In a case where the composition for forming a PZT-based piezoelectric film is a composition for forming a PLaZT-based piezoelectric film, it is preferable that the metal atom ratio (Pb:La:Mn:Zr:Ti) in the composition satisfy (1.00 to 1.20):(0.01 to 0.045):(0.01 to 0.045):(0.40 to 0.55):(0.45 to 0.60) and the total of metal atom ratio of Pb and La be 1. In this specification, a degree (high or low) of a piezoelectric constant means a degree (high and low) of an absolute value of a piezoelectric constant.

A concentration of the PZT-based precursor in 100 mass % of the composition is the same oxide concentration as that in the first embodiment. The critical range of the upper limit value and the lower limit value of the concentration of the PZT-based precursor is also the same as in the first embodiment.

As a diol as a main solvent contained in the composition, the diol shown in the first embodiment can be used.

The rate of the diol in 100 mass % of the composition is the same rate as in the first embodiment. The critical range of the upper limit value and the lower limit value of the rate of the diol is also the same as in the first embodiment.

In the same manner as in the first embodiment, examples of other solvents include carboxylic acid, alcohol (for example, ethanol or 1-butanol, or polyalcohol other than diol), ester, ketones (for example, acetone or methyl ethyl ketone), ethers (for example, dimethyl ether or diethyl ether), cycloalkanes (for example, cyclohexane or cyclohexanol), aromatics (for example, benzene, toluene, or xylene), and other tetrahydrofurans, and a mixed solvent obtained by mixing one or more kinds of these with a diol can also be used.

As specific examples of the carboxylic acid and specific examples of the ester, the same compounds as in the first embodiment can be exemplified.

A liquid viscosity adjuster contained in the composition has a great effect of preventing cracks of the formed piezoelectric film. As this liquid viscosity adjuster, polyvinylpyrrolidone (PVP), which is a polymer compound, is suitable for adjusting relative viscosity. A k value of polyvinylpyrrolidone contained in the composition of the second embodiment is preferably from 30 to 90. A molar ratio of polyvinylpyrrolidone to 1 mole of the PZT-based precursor is 0.005 moles to 0.25 moles, in terms of monomers.

In addition, it is preferable to add the linear monoalcohol having 6 to 12 carbon atoms to the composition of the second embodiment in the same manner as in the first embodiment. The rate of the linear monoalcohol having 6 to 12 carbon atoms added and the critical range thereof are the same as in the first embodiment.

In addition to the components described above, the same stabilizer as that in the first embodiment, if necessary, may be added in an amount of approximately 0.2 to 3 in terms of a value of (molecular number of stabilizer)/(metal atom number), in the same manner as in the first embodiment.

[Manufacturing Method of Composition for Forming Mn-Doped PZT-Based Piezoelectric Film]

A manufacturing method of the composition for forming a Mn-doped PZT-based piezoelectric film of the second embodiment will be described. In the manufacturing method of the composition for forming a Mn-doped PZT-based piezoelectric film of the second embodiment, the composition for forming a Mn-doped PZT-based piezoelectric film is prepared by the same procedure as in the manufacturing method of the composition for forming a Mn-doped PZT-based piezoelectric film of the first embodiment. The removal of particles after preparing the composition may also be performed by the same procedure as in the first embodiment.

[Forming Method of Mn-Doped PZT-Based Piezoelectric Film]

Next, a method of forming the Mn-doped PZT-based piezoelectric film of the second embodiment will be described. This forming method is a method of forming a piezoelectric film by using a sol-gel method and the composition for forming a Mn-doped PZT-based piezoelectric film described above is used as a raw material solution.

First, the composition for forming a Mn-doped PZT-based piezoelectric film described above is coated on a substrate and a coated film (gel film) having a predetermined thickness is formed. As the coating method or the substrate where a piezoelectric film is formed, the coating method and the substrate where the piezoelectric film is formed shown in the first embodiment can be used.

It is desired to form an orientation-controlled film in which crystalline orientation is preferentially controlled to the (100) plane or (001) plane on the lower electrode where a piezoelectric film is to be formed before forming the piezoelectric film. This is because a film having aligned polarization directions immediately after being formed can be formed by strongly orienting the Mn-doped PZT-based piezoelectric film to the (100) plane or (001) plane. Examples of the orientation-controlled film include a LNO film ($LaNiO_3$ film), a PZT film, or a $SrTiO_3$ film in which crystalline orientation is preferentially controlled to the (100) plane or (001) plane.

As a method of preferentially controlling crystal orientation of the orientation-controlled layer to the (100) plane, a method of forming a crystal grain size-controlling layer on a lower electrode when forming an orientation-controlled layer by applying a composition for forming a ferroelectric thin film onto the lower electrode of a substrate including the lower electrode having a crystal plane oriented in the (111) axial direction which is disclosed in Patent Document 2 and performing calcination and sintering of the composition, and setting the applied amount of the composition for forming a ferroelectric thin film so that a layer thickness of the orientation-controlled layer after crystallization is in a range of 35 nm to 150 nm and setting a temperature at the time of calcination to be in a range of 150° C. to 200° C. or 285° C. to 315° C. (hereinafter, referred to as a first method) is used, for example.

As a method of preferentially controlling crystal orientation of the orientation-controlled layer to the (110) plane, a method of forming a crystal grain size-controlling layer on a lower electrode when forming an orientation-controlled layer by applying a composition for forming a ferroelectric thin film onto the lower electrode of a substrate including the lower electrode having crystal plane oriented in the (111) axial direction which is disclosed in Patent Document 2 and performing calcination and sintering of the composition, and setting the applied amount of the composition for forming a ferroelectric thin film so that a layer thickness of the orientation-controlled layer after crystallization is in a range of 5 nm to 30 nm and setting a temperature at the time of calcination to be in a range of 180° C. to 300° C. (hereinafter, referred to as a second method) is used, for example.

After forming a coating film coated with the composition described above on a substrate, this coating film is calcinated, sintered, and crystallized. The calcination is performed under predetermined conditions by using a hot plate or a rapid heating process (RTA). The calcination conditions (atmosphere, temperature, time, procedure, and the like) are the same as in the first embodiment. In the same manner as in the first embodiment, since a low-boiling-point solvent or absorbed water molecules are particularly removed before the calcinations, low-temperature heating (drying) may be performed by using a hot plate at a temperature of 70° C. to 90° C. for 0.5 minutes to 5 minutes.

In a step from the application of the composition to the calcination, sintering can be finally collectively performed by repeating a plurality of steps up to the calcination so as to have a desired film thickness. When the composition of the second embodiment described above is used as the raw material solution, stress derived from film contraction generated at the time of forming a film can be prevented. Thus, a thick film having a thickness of 200 nm can be formed by a single coating step without generating voids or cracks. Accordingly, the number of steps to be repeated described above can be decreased.

The sintering is a step of performing thermal treatment of the coating film after the calcination at a temperature equal to or higher than a crystallization temperature to perform crystallization, and a piezoelectric film is obtained by performing this step. The sintering conditions (atmosphere, temperature, and time) in this crystallization step are the same as in the first embodiment. The sintering may be performed by using a rapid heating process (RTA). In a case of performing the sintering by using a rapid heating process (RTA), a rate of temperature rise thereof is preferably from 2.5° C./sec to 100° C./sec.

Figure 3:
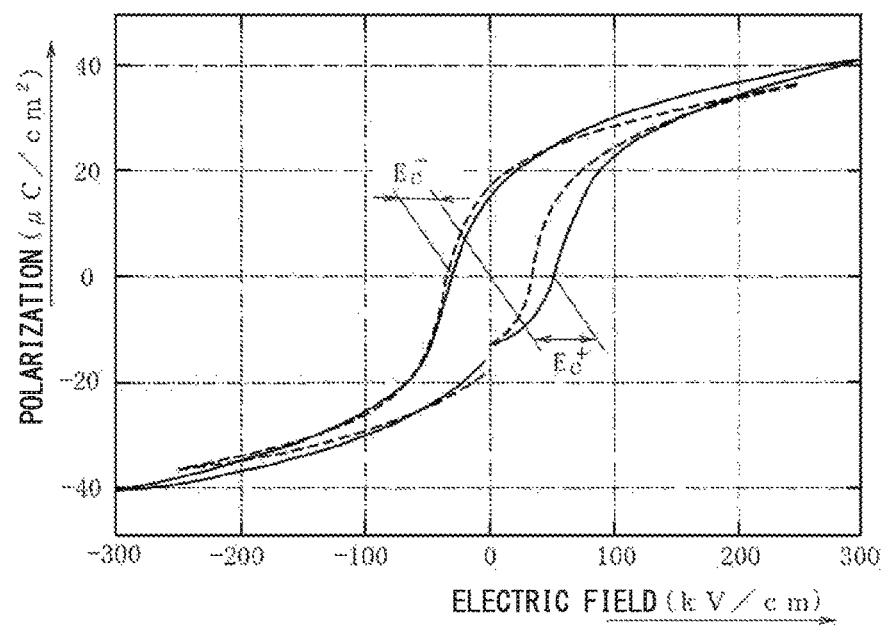
FIG. 3 is a diagram showing hysteresis curves of each piezoelectric film of a PZT-based piezoelectric film formed of Mn-doped composite metal oxides according to the second aspect of the present invention (shown with solid lines) and a PZT-based piezoelectric film (shown with broken lines) not doped with Mn.

By performing the steps described above, the Mn-doped PZT-based piezoelectric film of the second embodiment is obtained. In this piezoelectric film, it is possible to improve a piezoelectric constant by performing doping with Mn, and thus, it is possible to obtain greater displacement and to decrease a permittivity. Accordingly, in a case of using this piezoelectric film as a sensor, the advantages are increased. One main reason thereof is considered to be because Mn added is substituted with Zr or Ti and causes oxygen deficiency. As shown in FIG. 3, a hysteresis curve is greatly shifted to a positive side and polarization directions are aligned upwardly immediately after the film is formed. Since depolarization due to thermal treatment such as a reflowing process hardly occurs and excellent stability of polarization is obtained after the polarization process, it is possible to stably operate the film as a device by applying an electric field to a negative side.

[Mn-Doped PZT-Based Piezoelectric Film]

The Mn-doped PZT-based piezoelectric film of the second embodiment is a piezoelectric film in which Mn elements are added (doping) to Pb-containing composite metal oxides having a perovskite structure such as lead zirconate titanate (PZT). This piezoelectric film is a Mn-doped PZT-based piezoelectric film, a Mn-doped PNbZt-based piezoelectric film, or a Mn-doped PLaZT-based piezoelectric film. In this specification, these piezoelectric films are referred to as PZT-based piezoelectric films. This Mn-doped PZT-based piezoelectric film is formed by a CSD method and formed of Mn-doped composite metal oxides. When the total mole number of Zr and Ti in the composite metal oxides is set as 1 mole, a molar ratio of Mn is in a range of 0.01 to 0.045, this PZT-based piezoelectric film is preferentially crystal-oriented to the (100) plane or (001) plane, and a film thickness is from 0.8 μm to 3 μm. The preferential orientation means a state where an arbitrary peak intensity is relatively higher than another peak intensity, compared to a bulk X-ray diffraction pattern.

When the total mole number of Zr and Ti in the composite metal oxides is set as 1 mole, a molar ratio of Mn is preferably from 0.01 to 0.03.

In the Mn-doped PZT-based piezoelectric film of the second embodiment, the orientation degree of the (100) plane or (001) plane obtained by X-ray diffraction is equal to or greater than 95%. The upper limit value of the orientation degree can be set as 100%.

In a case of a PZT film which is not doped with Mn and is formed by a wet coating method such as a sol-gel method, piezoelectric properties are not exhibited, immediately after a film is formed. Thus, it is necessary to perform a polarization process. In contrast, in a film which is doped with Mn and is preferentially crystal-oriented to the (100) plane or (001) plane, a film in which an imprint phenomenon in which a hysteresis loop of polarization-electric field properties in which a vertical axis indicates polarization quantity and a horizontal axis indicates an electric field is shifted to a positive electric field side is exhibited, and polarization directions of the entire film are aligned upwardly immediately after being formed is obtained. Since such a film has excellent stability of polarization due to an imprint phenomenon realized by the doping of Mn, piezoelectric properties are not deteriorated, and a film more suitable as a piezoelectric material is obtained. In a case where the film is not preferentially crystal-oriented to the (100) plane or (001) plane, an imprint phenomenon is not realized and a self-poling phenomenon is not realized. When the film thickness is less than 0.8 μm, sufficient displacement is not obtained, and when the film thickness is greater than 3 μm, a certain period of time is taken for forming a film and productivity may be deteriorated. The preferred film thickness is from 1 μm to 2 μm.

In the Mn-doped PZT-based piezoelectric film, deviation D of a hysteresis loop of polarization-electric field properties shown in the following Formula (2) is preferably at least 8.8 kV/cm. In a case where the deviation D is less than 8.8 kV/cm, a sufficient polarization state is not obtained and sufficient piezoelectric properties are not exhibited. It is preferable to have great deviation D, but in practice, deviation of a hysteresis loop which can be achieved is 22 kV/cm. The deviation D is more preferably from 10.0 kV/cm to 22.0 kV/cm. A hysteresis loop shown with a solid line of FIG. 3 is that of the Mn-doped PZT-based piezoelectric film of the second embodiment and a hysteresis loop shown with a broken line of FIG. 3 is that of the Mn-not-doped PZT-based piezoelectric film. In FIG. 3, $E_c^+$ indicates an absolute value of a positive electric field value from 0 kV/cm when polarization quantity is 0 μC/cm², and $E_c^-$ indicates an absolute value of a negative electric field value from 0 kV/cm when polarization quantity is 0 μC/cm².

$$D=E_c^+-[(E_c^++E_c^-)/2] \quad (2)$$

This film can be used as a piezoelectric material in the same manner as in the first embodiment. Specifically, as shown in FIG. 2, a state in which each molecule 11a in a piezoelectric film 11 is polarized is maintained, before applying a DC voltage 14 between electrodes 12 and 13 disposed on both surfaces of the piezoelectric film 11 (FIG. 2(a)). As shown in FIG. 2(b), when a voltage is applied between the electrodes 12 and 13 disposed on both surfaces of the piezoelectric film 11, the piezoelectric film 11 elongates in a direction where the voltage is applied, and when this voltage is set as zero, the piezoelectric film 11 elongated in a direction where the voltage is applied, is contracted and returns to the original state (FIG. 2(a)), and thus, the piezoelectric film can be used as a piezoelectric element or the like.

EXAMPLES

Next, examples and comparative examples of the present invention will be described in detail.

Example A1

First, lead acetate trihydrate (Pb source) and propylene glycol (diol) were put into a reaction vessel and refluxed in the nitrogen atmosphere at a temperature of 150° C. for 1 hour, and manganese 2-ethylhexanoate (Mn source), zirconium tetrabutoxide (Zr source), titanium tetraisopropoxide (Ti source), and acetylacetone (stabilizer) were further added to this reaction vessel and refluxed and reacted with each other in the nitrogen atmosphere at a temperature of 150° C. for 1 hour to prepare synthesis liquid. Here, each PZT-based precursor of lead acetate trihydrate (Pb source), manganese 2-ethylhexanoate (Mn source), zirconium tetrabutoxide (Zr source), and titanium tetraisopropoxide (Ti source) was weighed so that a metal atom ratio (Pb:Mn:Zr:Ti) in the liquid became a value shown in Table 1. In addition, propylene glycol (diol) was added to have the content of 37 mass % with respect to 100 mass % of the composition after the preparation, and acetylacetone (stabilizer) was added so as to have 2 moles with respect to 1 mole of the PZT-based precursors contained in the prepared composition. Then, unnecessary solvent was removed by performing vacuum distillation, so that a concentration of the PZT-based precursor in 100 mass % of the composition was 35 mass % in terms of an oxide concentration. Here, the oxide concentration of the concentration of the PZT-based precursor in the synthesis liquid is a concentration (an oxide conversion value) of metal oxides in 100 mass % of the synthesis liquid which is calculated by assuming that all of the metal atoms contained in the synthesis liquid are desired oxides.

Then, the synthetic liquid was cooled to 25° C. by performing natural cooling at room temperature. 1-Octanol (linear monoalcohol having 8 carbon atoms) and ethanol (solvent) were added to this synthesis liquid to obtain a sol-gel solution in which a concentration of the PZT-based precursor in 100 mass % of a sol-gel liquid was 25 mass % in terms of an oxide concentration. The oxide concentration of the concentration of the PZT-based precursor in the sol-gel solution is a concentration (an oxide conversion value) of metal oxides in 100 mass % of the sol-gel solution which is calculated by assuming that all of the metal atoms contained in a sol-gel solution are desired oxides.

Then, polyvinylpyrrolidone (PVP: k value=30) was added to the sol-gel solution so as to obtain 0.025 moles of polyvinylpyrrolidone with respect to 1 mole of the PZT-based precursor, in terms of monomers, and stirred at room temperature (25° C.) for 24 hours to obtain a composition. This composition was force-feeded and filtered with a syringe by using a commercially available membrane filter having a hole diameter of 0.05 μm, and accordingly, the number of particles having a particle size equal to or greater than 0.5 μm was 1 per 1 milliliter of the solution. The concentration of the PZT-based precursor in 100 mass % of the composition was 17 mass % in terms of an oxide concentration (oxide conversion value). The oxide concentration of the concentration of the PZT-based precursor in the composition is a concentration (an oxide conversion value) of metal oxides in 100 mass % of the composition which is calculated by assuming that all of the metal atoms contained in the composition are desired oxides. In addition, 4 mass % of 1-octanol (linear monoalcohol having 8 carbon atoms) was contained in 100 mass % of the composition. Further, 37 mass % of propylene glycol (diol) was contained in 100 mass % of the composition.

A silicon substrate, in which a $SiO_2$ film, a $TiO_2$ film, and a Pt film were laminated from the bottom to the top in this order, set on a spin coater. The obtained composition was added dropwise from the top of the Pt film (lower electrode) which was an uppermost layer of a silicon substrate, and spin coating was performed at a rotation rate of 1800 rpm for 60 seconds, and accordingly, a coated film (gel film) was formed on the Pt film (lower electrode). A silicon substrate where this coated film (gel film) was formed was heated and held (dried) at a temperature of 75° C. for 1 minute by using a hot plate to remove a low-boiling-point solvent or water. After that, the gel film was heated and decomposed by heating and holding (calcination in a first stage) the substrate using a hot plate at 300° C. for 5 minutes. Organic materials or absorbed water remaining in the gel film was removed by heating and holding (calcination in a second stage) using another hot plate at 450° C. for 5 minutes. By doing so, a calcinated film (Mn-doped PZT amorphous film) having a thickness of 200 nm was obtained. A calcinated film having a thickness of 400 nm was obtained by repeating the same operation as described above twice. A silicon substrate where the calcinated film having a thickness of 400 nm was formed was sintered by holding the silicon substrate in the oxygen atmosphere at 700° C. for 1 minute by using a rapid heating process (RTA). A rate of temperature rise at this time was 10° C./sec. By doing so, a piezoelectric film having a thickness of 400 nm was formed on the Pt film (lower electrode). As the film thickness of the piezoelectric film, a thickness (total thickness) of a cross-section of the piezoelectric film was measured with SEM (S4300 manufactured by Hitachi, Ltd.). When the composition of the formed piezoelectric film was measured by X-ray fluorescence analysis, the piezoelectric film was a film having a composition shown as $Pb_{1.01}Mn_{0.002}Zr_{0.40}Ti_{0.60}O_3$. In Example A1 or the like, a decrease in the amount of Pb was observed in the formed film, but this was due to the evaporation of the Pb source during the film formation such as sintering.

Example A2

A composition was prepared in the same manner as in Example A1, except for using manganese naphthenate instead of manganese 2-ethylhexanoate as the Mn source, weighing each PZT-based precursor of lead acetate trihydrate (Pb source), manganese naphthenate (Mn source), zirconium tetrabutoxide (Zr source), and titanium tetraisopropoxide (Ti source) so that a metal atom ratio (Pb:Mn:Zr:Ti) in the liquid became a value shown in Table 1, and adjusting the concentration of the PZT-based precursor in 100 mass % of the composition to be a value shown in Table 1, in terms of an oxide concentration, and a piezoelectric film was formed. The formed piezoelectric film was a film having a composition shown as $Pn_{1.02}Mn_{0.002}Zr_{0.52}Ti_{0.48}O_3$.

Example A3

A composition was prepared in the same manner as in Example A1, except for using manganese acetate instead of manganese 2-ethylhexanoate as the Mn source, weighing each PZT-based precursor of lead acetate trihydrate (Pb source), manganese acetate (Mn source), zirconium tetrabutoxide (Zr source), and titanium tetraisopropoxide (Ti source) so that a metal atom ratio (Pb:Mn:Zr:Ti) in the liquid became a value shown in Table 1, and adjusting the concentration of the PZT-based precursor in 100 mass % of the composition to be a value shown in Table 1, in terms of an oxide concentration, and a piezoelectric film was formed. The formed piezoelectric film was a film having a composition shown as $Pb_{1.01}Mn_{0.002}Zr_{0.55}Ti_{0.45}O_3$.

Example A4 to Example A9

A composition was prepared in the same manner as in Example A1, except for using acetylacetone manganese instead of manganese 2-ethylhexanoate as the Mn source, weighing each PZT-based precursor of lead acetate trihydrate (Pb source), acetylacetone manganese (Mn source), zirconium tetrabutoxide (Zr source), and titanium tetraisopropoxide (Ti source) so that a metal atom ratio (Pb:Mn:Zr:Ti) in the liquid became a value shown in Table 1, and adjusting the concentration of the PZT-based precursor in 100 mass % of the composition to be a value shown in Table 1, in terms of an oxide concentration, and a piezoelectric film was formed. The piezoelectric film formed in Example A4 was a film having a composition shown as $Pb_{1.02}Mn_{0.01}Zr_{0.40}Ti_{0.60}O_3$, the piezoelectric film formed in Example A5 was a film having a composition shown as $Pb_{1.01}Mn_{0.01}Zr_{0.52}Ti_{0.48}O_3$, the piezoelectric film formed in Example A6 was a film having a composition shown as $Pb_{1.02}Mn_{0.01}Zr_{0.55}Ti_{0.45}O_3$, the piezoelectric film formed in Example A7 was a film having a composition shown as $Pb_{1.00}Mn_{0.04}Zr_{0.40}Ti_{0.60}O_3$, the piezoelectric film formed in Example A8 was a film having a composition shown as $Pb_{1.00}Mn_{0.04}Zr_{0.52}Ti_{0.48}O_3$, and the piezoelectric film formed in Example A9 was a film having a composition shown as $Pb_{1.01N}Mn_{0.04}Zr_{0.55}Ti_{0.45}O_3$.

Example A10 and Example A11

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1 and adjusting the concentration of the PZT-based precursor in 100 mass % of the composition to be a value shown in Table 1, in terms of an oxide concentration, and a piezoelectric film was formed. The piezoelectric film formed in Example A10 was a film having a composition shown as $Pb_{0.98}Mn_{0.04}Zr_{0.52}Ti_{0.48}O_3$. The piezoelectric film formed in Example A11 was a film having a composition shown as $Pb_{1.05}Mn_{0.04}Zr_{0.52}Ti_{0.48}O_3$.

Example A12 to Example A15

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1 and adjusting the concentration of the PZT-based precursor in 100 mass % of the composition to be a value shown in Table 1, in terms of an oxide concentration, and a piezoelectric film was formed.

The piezoelectric films formed in Example A12 to Example A15 were films having a composition shown as $Pb_{1.02}Mn_{0.04}Zr_{0.55}Ti_{0.45}O_3$.

Comparative Example A1

A composition was prepared in the same manner as in Example A1, except for weighing each PZT-based precursor of lead acetate trihydrate (Pb source), zirconium tetrabutoxide (Zr source), and titanium tetraisopropoxide (Ti source) so that a metal atom ratio (Pb:Mn:Zr:Ti) in the liquid became a value shown in Table 1, without using the PZT-based precursor as the Mn source, and adjusting the concentration of the PZT-based precursor in 100 mass % of the composition to be a value shown in Table 1, in terms of an oxide concentration, and a piezoelectric film was formed. The formed piezoelectric film was a film having a composition shown as $Pb_{1.00}Zr_{0.52}Ti_{0.48}O_3$.

Comparative Example A2 to Comparative Example A4

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1 and adjusting the concentration of the PZT-based precursor in 100 mass % of the composition to be a value shown in Table 1, in terms of an oxide concentration, and a piezoelectric film was formed. The piezoelectric film formed in Comparative Example A2 was a film having a composition shown as $Pb_{1.01}Mn_{0.001}Zr_{0.40}Ti_{0.60}O_3$, the piezoelectric film formed in Comparative Example A3 was a film having a composition shown as $Pb_{1.01}Mn_{0.001}Zr_{0.52}Ti_{0.48}O_3$, and the piezoelectric film formed in Comparative Example A4 was a film having a composition shown as $Pb_{1.01}Mn_{0.05}Zr_{0.55}Ti_{0.45}O_3$.

Comparative Example A5 and Comparative Example A6

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1, setting a mixing molar ratio of polyvinylpyrrolidone (PVP) to 1 mole of the PZT-based precursor shown in Table 1, and adjusting the concentration of the PZT-based precursor in 100 mass % of the composition to be a value shown in Table 1, in terms of an oxide concentration, and a piezoelectric film was formed. The piezoelectric film formed in Comparative Example A5 was a film having a composition shown as $Pb_{1.01}Mn_{0.01}Zr_{0.40}Ti_{0.60}O_3$ and the piezoelectric film formed in Comparative Example A6 was a film having a composition shown as $Pb_{1.02}Mn_{0.01}Zr_{0.52}Ti_{0.48}O_3$.

Comparative Example A7 and Comparative Example A8

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1, setting a mixing rate of propylene glycol (diol)in 100 mass % of the composition as a rate shown in Table 1, and adjusting the concentration of the PZT-based precursor in 100 mass % of the composition to be a value shown in Table 1, in terms of an oxide concentration, and a piezoelectric film was formed. The piezoelectric film formed in Comparative Example A7 was a film having a composition shown as $Pb_{1.02}Mn_{0.01}Zr_{0.55}Ti_{0.45}O_3$ and the piezoelectric film formed in Example A8 was a film having a composition shown as $Pb_{1.01}Mn_{0.01}Zr_{0.40}Ti_{0.60}O_3$.

Comparative Example A9 and Comparative Example A10

A composition was prepared in the same manner as in Example A1, except for using manganese naphthenate instead of manganese 2-ethylhexanoate as the Mn source, weighing each PZT-based precursor of lead acetate trihydrate (Pb source), manganese naphthenate (Mn source), zirconium tetrabutoxide (Zr source), and titanium tetraisopropoxide (Ti source) so that a metal atom ratio (Pb:Mn:Zr:Ti) in the liquid became a value shown in Table 1, and adjusting the concentration of the PZT-based precursor in 100 mass % of the composition to be a value shown in Table 1, in terms of an oxide concentration, and a piezoelectric film was formed. The piezoelectric film formed in Comparative Example A9 was a film having a composition shown as $Pb_{1.01}Mn_{0.01}Zr_{0.57}Ti_{0.43}O_3$ and the piezoelectric film formed in Comparative Example A10 was a film having a composition shown as $Pb_{1.01}Mn_{0.01}Zr_{0.38}Ti_{0.62}O_3$.

Comparative Example A11 and Comparative Example A12

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1 and adjusting the concentration of the PZT-based precursor in 100 mass % of the composition to be a value shown in Table 1, in terms of an oxide concentration, and a piezoelectric film was formed. The piezoelectric films formed in Comparative Examples A11 and A12 were films having a composition shown as $Pb_{1.00}Mn_{0.01}Zr_{0.52}Ti_{0.48}O_3$.

Comparative Example A13 and Example A14

A composition was prepared in the same manner as in Example A1, except for weighing each PZT-based precursor of lead acetate trihydrate (Pb source), manganese 2-ethylhexanoate (Mn source), zirconium tetrabutoxide (Zr source), and titanium tetraisopropoxide (Ti source) so that a metal atom ratio (Pb:Mn:Zr:Ti) in the liquid became a value shown in Table 1 and adjusting the concentration of the PZT-based precursor in 100 mass % of the composition to be a value shown in Table 1, in terms of an oxide concentration, and a piezoelectric film was formed. The piezoelectric film formed in Comparative Example A13 was a film having a composition shown as $Pb_{0.98}Mn_{0.04}Zr_{0.52}Ti_{0.48}O_3$. The piezoelectric film formed in Comparative Example A14 was a film having a composition shown as $Pb_{1.10}Mn_{0.04}Zr_{0.52}Ti_{0.48}O_3$.

<Comparative Test and Evaluation>

Regarding the piezoelectric films formed in Example A1 to Example A15 and Comparative Example A1 to Comparative Example A14, deviation of the hysteresis, a dielectric constant, a piezoelectric constant $e_{31,f}$, presence or absence of cracks were evaluated. In addition, regarding each piezoelectric film, an orientation degree of crystals to the (100) plane was evaluated. The results thereof are shown in Table 1.

(i) Deviation (shift amount) of the hysteresis: first, a pair of electrodes having a diameter of 200 μmϕ were formed on the upper surface of the piezoelectric film by using a sputtering method, the piezoelectric film was maintained in the oxygen atmosphere at 700° C. for 1 minute using the RTA, and annealed to recover damage, and a capacitor structure was prepared. Then, by using these as test samples, the hysteresis of the polarization quantity of the piezoelectric film was measured by applying a voltage of 25 V at a frequency of 1 kHz, and deviation of the hysteresis of the obtained polarization quantity was obtained. For comparison, hysteresis curves of Example A5 and Comparative Example A1 measured by using this method are shown in FIG. 1.

(ii) Dielectric constant: after measuring a permittivity of the piezoelectric element used for measuring the deviation of the hysteresis of the piezoelectric film using a ferroelectrics evaluation device (TF-analyzer 2000 manufactured by aixACCT Systems), dielectric constant was calculated by dividing the measured permittivity by a permittivity of vacuum for realizing dimensionless quantity.

(iii) Piezoelectric constant $e_{31,f}$: the piezoelectric film was processed into a strip form using focused ion beams (FIB), and the piezoelectric film processed into a strip form was held in an electric field of 100 kV/cm at a temperature of 110° C. for 1 minute to perform a polarization process. The charge amount generated by applying strain to the piezoelectric film subjected to the polarization process was measured using a piezoelectrics evaluation device (aixPES manufactured by aixACCT Systems) to obtain a piezoelectric constant $e_{31,f}$.

(iv) Presence or absence of cracks: presence or absence of cracks was determined from an SEM image obtained by imaging textures of a film front surface and a film cross-section, using a scanning electron microscope (SEM) used in the film thickness measurement described above. It was determined as "absence" when cracks were not observed, and it was determined as "presence" when cracks were observed.

(v) Orientation degree: an orientation degree was calculated by calculating strength of (100) plane/{strength of (100) plane+strength of (110) plane+strength of (111) plane} from a diffraction result obtained by a concentration method using an X-ray diffraction (XRD) device (type name: Empyrean manufactured by PANalytical B.V.).

TABLE 1

| | Metal atom ratio in composition | Composition of Mn-doped PZT-based piezoelectric film (Metal atom ratio) | | | | Precursor concentration (value in terms of oxides) | PVP | Diol [mass | Deviation of hysteresis | Dielectric | Piezoelectric constant | Presence or absence of | Orientation degree |
|---|---|---|---|---|---|---|---|---|---|---|---|---|---|
| | (Pb:Mn:Zr:Ti) | Pb | Mn | Zr | Ti | [mass %] | [moles] | %] | [kV/cm] | constant | $e_{31f}$ | cracks | [%] |
| Example A1 | 1.15:0.002:0.40:0.60 | 1.01 | 0.002 | 0.40 | 0.60 | 17 | 0.02 | 30 | 2 | 1270 | −14.3 | Absent | 92 |
| Example A2 | 1.15:0.002:0.52:0.48 | 1.02 | 0.002 | 0.52 | 0.48 | 25 | 0.02 | 30 | 1 | 1320 | −15.2 | Absent | 95 |
| Example A3 | 1.15:0.002:0.55:0.45 | 1.01 | 0.002 | 0.55 | 0.45 | 25 | 0.02 | 30 | 1 | 1350 | −13.2 | Absent | 90 |
| Example A4 | 1.16:0.01:0.40:0.60 | 1.02 | 0.01 | 0.40 | 0.60 | 35 | 0.02 | 30 | 6 | 1010 | −10.1 | Absent | 90 |
| Example A5 | 1.16:0.01:0.52:0.48 | 1.01 | 0.01 | 0.52 | 0.48 | 25 | 0.02 | 30 | 5 | 1200 | −12.3 | Absent | 98 |
| Example A6 | 1.16:0.01:0.55:0.45 | 1.02 | 0.01 | 0.55 | 0.45 | 25 | 0.02 | 30 | 6 | 1180 | −11.2 | Absent | 98 |
| Example A7 | 1.19:0.04:0.40:0.60 | 1.00 | 0.04 | 0.40 | 0.60 | 25 | 0.02 | 30 | 21 | 940 | −8.6 | Absent | 99 |
| Example A8 | 1.19:0.04:0.52:0.48 | 1.00 | 0.04 | 0.52 | 0.48 | 25 | 0.02 | 30 | 15 | 1070 | −13.6 | Absent | 100 |
| Example A9 | 1.19:0.04:0.55:0.45 | 1.01 | 0.04 | 0.55 | 0.45 | 25 | 0.02 | 30 | 11 | 1000 | −11.2 | Absent | 90 |
| Example A10 | 1.00:0.04:0.52:0.48 | 0.98 | 0.04 | 0.52 | 0.48 | 25 | 0.02 | 30 | 16 | 1000 | −13.6 | Absent | 95 |
| Example A11 | 1.20:0.04:0.52:0.48 | 1.05 | 0.04 | 0.52 | 0.48 | 25 | 0.02 | 30 | 10 | 920 | −9.9 | Absent | 92 |
| Example A12 | 1.16:0.04:0.55:0.45 | 1.02 | 0.04 | 0.55 | 0.45 | 25 | 0.005 | 30 | 5 | 1020 | −11.4 | Absent | 90 |
| Example A13 | 1.16:0.04:0.55:0.45 | 1.02 | 0.04 | 0.55 | 0.45 | 25 | 0.25 | 30 | 5 | 1280 | −11.8 | Absent | 94 |
| Example A14 | 1.16:0.04:0.55:0.45 | 1.02 | 0.04 | 0.55 | 0.45 | 25 | 0.02 | 16 | 6 | 1160 | −11.6 | Absent | 91 |
| Example A15 | 1.16:0.04:0.55:0.45 | 1.02 | 0.04 | 0.55 | 0.45 | 25 | 0.02 | 56 | 5 | 1120 | −12.2 | Absent | 93 |

TABLE 2

| | Metal atom ratio in composition | Composition of Mn-doped PZT-based piezoelectric film (Metal atom ratio) | | | | Precursor concentration (value in terms of oxides) | PVP | Diol [mass | Deviation of hysteresis | Dielectric | Piezoelectric constant | Presence or absence of | Orientation degree |
|---|---|---|---|---|---|---|---|---|---|---|---|---|---|
| | (Pb:Mn:Zr:Ti) | Pb | Mn | Zr | Ti | [mass %] | [moles] | %] | [kV/cm] | constant | $e_{31f}$ | cracks | [%] |
| Comparative Example A1 | 1.15:0:0.52:0.48 | 1.00 | 0 | 0.52 | 0.48 | 25 | 0.02 | 30 | 0 | 1550 | −12.9 | Absent | 93 |
| Comparative Example A2 | 1.15:0.001:0.40:0.60 | 1.01 | 0.001 | 0.40 | 0.60 | 25 | 0.02 | 30 | 1 | 1400 | −10 | Absent | 94 |
| Comparative Example A3 | 1.15:0.001:0.52:0.48 | 1.01 | 0.001 | 0.52 | 0.48 | 25 | 0.02 | 30 | 15 | 1500 | −12.5 | Absent | 93 |
| Comparative Example A4 | 1.20:0.05:0.55:0.45 | 1.01 | 0.05 | 0.55 | 0.45 | 25 | 0.02 | 30 | 12 | 1000 | −7.2 | Absent | 92 |
| Comparative Example A5 | 1.16:0.01:0.40:0.60 | 1.01 | 0.01 | 0.40 | 0.60 | 25 | 0.004 | 30 | 8 | 1100 | −9.6 | Present | 90 |
| Comparative Example A6 | 1.16:0.01:0.52:0.48 | 1.02 | 0.01 | 0.52 | 0.48 | 25 | 0.03 | 30 | 7 | 1150 | −8.3 | Absent | 90 |
| Comparative Example A7 | 1.16:0.01:0.55:0.45 | 1.02 | 0.01 | 0.55 | 0.45 | 25 | 0.02 | 15 | 8 | 1200 | −9.6 | Present | 90 |
| Comparative Example A8 | 1.16:0.01:0.40:0.60 | 1.01 | 0.01 | 0.40 | 0.60 | 25 | 0.02 | 60 | 7 | 1130 | −6 | Absent | 92 |
| Comparative Example A9 | 1.16:0.01:0.57:0.43 | 1.01 | 0.01 | 0.57 | 0.43 | 25 | 0.02 | 30 | 5 | 1230 | −8.3 | Absent | 91 |
| Comparative Example A10 | 1.16:0.01:0.38:0.62 | 1.01 | 0.01 | 0.38 | 0.62 | 25 | 0.02 | 30 | 6 | 820 | −6.5 | Absent | 90 |
| Comparative Example A11 | 1.16:0.01:0.52:0.48 | 1.00 | 0.01 | 0.52 | 0.48 | 15 | 0.02 | 30 | 4 | 1210 | −10.3 | Absent | 92 |
| Comparative Example A12 | 1.16:0.01:0.52:0.48 | 1.00 | 0.01 | 0.52 | 0.48 | 38 | 0.02 | 30 | 3 | 1230 | −7.3 | Present | 93 |
| Comparative Example A13 | 0.99:0.04:0.52:0.48 | 0.98 | 0.04 | 0.52 | 0.48 | 30 | 0.02 | 30 | 10 | 820 | −6.2 | Absent | 94 |
| Comparative Example A14 | 1.21:0.04:0.52:0.48 | 1.10 | 0.04 | 0.52 | 0.48 | 30 | 0.02 | 30 | 12 | 1300 | −10.2 | Absent | 98 |

As shown in Table 1, the shift of the hysteresis was not observed in Comparative Example A1 where doping of Mn was not performed when Example A1 to Example A15 and Comparative Example A1 to Comparative Example A4 were compared to each other. In Comparative Example A2 where the doping amount of Mn was small and x in the general formula $Pb_zMn_xZr_yTi_{1-y}O_3$ showing the film composition after the film was formed does not satisfy the lower limit value, the dielectric constant was not sufficiently decreased. Also, in Comparative Example A3, the dielectric constant was not sufficiently decreased. In Comparative Example A4 where the doping amount of Mn was great and x in the general formula showing the film composition after the film was formed exceeds the upper limit value, the piezoelectric constant was not decreased. With respect to this, in Examples A1 to Examples A15 where doping of Mn was performed at a desired rate, the permittivity can be decreased in a state where the piezoelectric constant was maintained at a comparatively high value, and a piezoelectric film useful as a sensor was obtained. The shift of the hysteresis was observed and it was determined that depolarization hardly occurs after the polarization process.

When Example A1 to Example A15 and Comparative Example A5 to Comparative Example A8 were compared to each other, in Comparative Example A5 and Comparative Example A7 where the molar ratio of PVP or diol does not satisfy the lower limit value, generation of cracks on the obtained piezoelectric film was observed. In contrast, in Comparative Example A6 and Comparative Example A8 were the molar ratio of PVP or diol exceeds the upper limit value, generation of cracks was not observed, but piezoelectric constant was decreased. With respect to this, in Examples A1 to Examples A15 where PVP and diol were added at desired rates, cracks were not generated when forming a film thickness equal to or greater than 150 nm, a decrease in piezoelectric constant generated in Comparative Example A6 and Comparative Example A8 was not shown, and a piezoelectric film having excellent properties was obtained. Therefore, it was found that the piezoelectric films obtained in Examples A1 to Examples A15 have high productivity.

When Examples A1 to Examples A15 and Comparative Example A9 and Comparative Example A10 were compared to each other, in Comparative Example A9 where the metal atom ratio of Ti was smaller than the metal atom ratio of Zr and y in the general formula showing the film composition after the film was formed exceeds the upper limit value, the piezoelectric constant was decreased. In Comparative Example A10 where the metal atom ratio of Ti was greater than the metal atom ratio of Zr and y in the general formula showing the film composition after the film was formed does not satisfy the lower limit value, the piezoelectric constant was decreased. With respect to this, in Examples A1 to Examples A15 where the rates of Zr and Ti satisfy a desired range, a decrease in piezoelectric constant generated in Comparative Example A9 and Comparative Example A10 was not shown, and a piezoelectric film having excellent properties was obtained.

When Example A1 to Example A15 and Comparative Example A11 and Comparative Example A12 were compared to each other, in Comparative Example A11 where the precursor concentration does not satisfy the lower limit value, the limit of the film thickness formed by a single coating was 130 nm and sufficient film thickness cannot be formed. In contrast, in Comparative Example A12 where the precursor concentration exceeds the upper limit value, piezoelectric constant was decreased and cracks were generated. With respect to this, in Examples A1 to Examples A15 where the precursor concentration was adjusted to be in a desired range, problems generated in Comparative Example A11 and Comparative Example A12 were not generated and a piezoelectric film having excellent properties was obtained.

When Examples A1 to Examples A15 and Comparative Example A13 and Comparative Example A14 were compared to each other, in Comparative Example A13 where the metal atom ratio of Pb was small and z in the general formula showing the film composition after the film was formed does not satisfy the lower limit value, the piezoelectric constant was decreased. In contrast, in Comparative Example A14 where the metal atom ratio of Pb was great and z in the general formula showing the film composition after the film was formed exceeds the upper limit value, the dielectric constant was not sufficiently decreased. With respect to this, in Examples A1 to Examples A15 where the metal atom ratio of Pb satisfies a desired range, problems generated in Comparative Example A13 and Comparative Example A14 were not generated and a piezoelectric film having excellent properties was obtained.

Example B1

First, lead acetate trihydrate (Pb source) and propylene glycol (diol) were put into a reaction vessel and refluxed in the nitrogen atmosphere at a temperature of 150° C. for 1 hour, and titanium tetraisopropoxide (Ti source), zirconium tetrabutoxide (Zr source), manganese 2-ethylhexanoate (Mn source), and acetylacetone (stabilizer) were further added to this reaction vessel and refluxed and reacted with each other in the nitrogen atmosphere at a temperature of 150° C. for 1 hour to prepare synthesis liquid. Here, each PZT-based precursor of lead acetate trihydrate (Pb source), manganese 2-ethylhexanoate (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. In addition, propylene glycol (diol) was added to have the content of 37 mass % with respect to 100 mass % of the composition after the preparation, and acetylacetone (stabilizer) was added at a rate so as to have 2 moles with respect to 1 mole of the PZT-based precursors contained in the prepared composition. Then, unnecessary solvent was removed by performing vacuum distillation, so that a concentration of the PZT-based precursor in 100 mass % of the composition was 35 mass % in terms of an oxide concentration. Here, the oxide concentration of the concentration of the PZT-based precursor in the synthesis liquid is a concentration (an oxide conversion value) of metal oxides in 100 mass % of the synthesis liquid which is calculated by assuming that all of the metal atoms contained in the synthesis liquid are desired oxides.

Then, the synthetic liquid was cooled to 25° C. by performing natural cooling at room temperature. 1-Octanol (linear monoalcohol having 8 carbon atoms) and ethanol (solvent) were added to this synthesis liquid to obtain a sol-gel solution in which a concentration of the PZT-based precursor in 100 mass % of a sol-gel liquid was 25 mass % in terms of an oxide concentration. The oxide concentration of the concentration of the PZT-based precursor in the sol-gel solution is a concentration (an oxide conversion value) of metal oxides in 100 mass % of the sol-gel solution which is calculated by assuming that all of the metal atoms contained in a sol-gel solution are desired oxides.

Then, polyvinylpyrrolidone (PVP: k value=30) was added to the sol-gel solution so as to obtain 0.025 moles of polyvinylpyrrolidone with respect to 1 mole of the PZT-based precursor, in terms of monomers, and stirred at room temperature (25° C.) for 24 hours to obtain a composition. This composition was force-feeded and filtered with a syringe by using a commercially available membrane filter having a hole diameter of 0.05 μm, and accordingly, the number of particles having a particle size equal to or greater than 0.5 μm was 1 per 1 milliliter of the solution. The concentration of the PZT-based precursor in 100 mass % of the composition was 17 mass % in terms of an oxide concentration (oxide conversion value). The oxide concentration of the concentration of the PZT-based precursor in the composition is a concentration (an oxide conversion value) of metal oxides in 100 mass % of the composition which is calculated by assuming that all of the metal atoms contained in the composition are desired oxides. In addition, 4 mass % of 1-octanol (linear monoalcohol having 8 carbon atoms) was contained in 100 mass % of the composition. Further, 37 mass % of propylene glycol (diol) was contained in 100 mass % of the composition.

A silicon substrate was prepared in which a SiO$_2$ film, a TiO$_x$ film, and a Pt film were laminated from the bottom to the top in this order, and a PZT film as an orientation-controlled layer having an orientation degree of the (100) plane of 96% by using the first method described above was formed on the Pt film. A film thickness of the SiO$_2$ film was 500 nm, a film thickness of the TiO$_2$ film was 20 nm, and a film thickness of the Pt film was 100 nm. A film thickness of orientation-controlled layer was 60 nm and a diameter of the silicon substrate was 4 inches. After setting this silicon substrate on a spin coater, 1000 µL of the obtained composition was added dropwise from the top of the orientation-controlled layer of the silicon substrate, and spin coating was performed at a rotation rate of 1800 rpm for 60 seconds, and accordingly, a coated film (gel film) was formed on the orientation-controlled layer.

A silicon substrate where this coated film (gel film) was formed was heated and held (dried) at a temperature of 75° C. for 1 minute by using a hot plate to remove a low-boiling-point solvent or water. After that, the gel film was heated and decomposed by heating and holding (calcination in a first stage) the substrate using a hot plate at 300° C. for 5 minutes. Organic materials or absorbed water remaining in the gel film was removed by heating and holding (calcination in a second stage) using another hot plate at 450° C. for 5 minutes. By doing so, a calcinated film (Mn-doped PZT amorphous film) having a thickness of 200 nm was obtained. The thickness of 200 nm was a thickness after sintering which will be described later.

A calcinated film having a thickness of 400 nm was obtained by repeating the same operation as described above twice. The thickness of 400 nm was a thickness after sintering which will be described later. A silicon substrate where the calcinated film having a thickness of 400 nm was formed was sintered by holding the silicon substrate in the oxygen atmosphere at 700° C. for 1 minute by using a rapid heating process (RTA). A rate of temperature rise at this time was 10° C./sec. A series of operations including the application of the composition, and the calcination and the sintering of the coating film described above was repeated three times to form a Mn-doped PZT-based piezoelectric film on the orientation-controlled layer on the Pt film (lower electrode). When the composition of the formed piezoelectric film was measured by X-ray fluorescence analysis, the piezoelectric film was a film having a composition shown as Pb$_{1.01}$Mn$_{0.01}$Zr$_{0.52}$Ti$_{0.48}$O$_3$. In Example B1, the Examples B2 to B12 and Comparative Example B1 which will be described later, a decrease in the amount of Pb was observed in the formed film, but this was due to the evaporation of the Pb source during the film formation such as sintering.

Example B2

Manganese naphthenate was used as the Mn source instead of manganese 2-ethylhexanoate. Each PZT-based precursor of lead acetate trihydrate (Pb source), manganese naphthenate (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. Except for the above-mentioned changes, a composition was prepared in the same manner as in Example B1, and a piezoelectric film was formed on the PZT orientation-controlled layer having an orientation degree of the (100) plane of 96%, which was the same as that in Example B1, by repeating the application, calcination, and sintering by using the same method as in Example B1. The formed piezoelectric film was a film having a composition shown as Pb$_{1.02}$Mn$_{0.02}$Zr$_{0.52}$Ti$_{0.48}$O$_3$.

Example B3

Manganese acetate was used as the Mn source instead of manganese 2-ethylhexanoate. Each PZT-based precursor of lead acetate trihydrate (Pb source), manganese acetate (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. A PZT-based piezoelectric film was formed on the orientation-controlled layer having an orientation degree of the (100) plane of 96%. Except for the above-mentioned changes, a composition was prepared in the same manner as in Example B1, and a piezoelectric film was formed by repeating the application, calcination, and sintering by using the same method as in Example B1. Since the number of laminated layers in Example B was 5, the final layer was sintered with a thickness of 200 nm. The formed piezoelectric film was a film having a composition shown as Pb$_{1.03}$Mn$_{0.042}$Zr$_{0.52}$Ti$_{0.48}$O$_3$.

Example B4

Acetylacetone manganese was used as the Mn source instead of manganese 2-ethylhexanoate. Each PZT-based precursor of lead acetate trihydrate (Pb source), acetylacetone manganese (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. A PZT-based orientation-controlled layer was formed on the orientation-controlled layer having an orientation degree of the (100) plane of 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as Pb$_{1.02}$Mn$_{0.02}$Zr$_{0.45}$Ti$_{0.55}$O$_3$.

Example B5

Acetylacetone manganese was used as the Mn source instead of manganese 2-ethylhexanoate. Each PZT-based precursor of lead acetate trihydrate (Pb source), acetylacetone manganese (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. A piezoelectric film was formed on an orientation-controlled layer having an orientation degree of the (100) plane of 76% by using the first method described above. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.02}Mn_{0.02}Zr_{0.52}Ti_{0.48}O_3$.

Example B6

Acetylacetone manganese was used as the Mn source instead of manganese 2-ethylhexanoate. Each PZT-based precursor of lead acetate trihydrate (Pb source), acetylacetone manganese (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. Except for the above-mentioned changes, a composition was prepared in the same manner as in Example B1, and a piezoelectric film was formed on the PZT-orientation-controlled layer having an orientation degree of the (100) plane of 96%, which was the same as that in Example B1, by repeating the application, calcination, and sintering by using the same method as in Example B1. The formed piezoelectric film was a film having a composition shown as $Pb_{1.02}Mn_{0.005}Zr_{0.52}Ti_{0.48}O_3$.

Example B7

Acetylacetone manganese was used as the Mn source instead of manganese 2-ethylhexanoate. Each PZT-based precursor of lead acetate trihydrate (Pb source), acetylacetone manganese (Mn source), zirconium tetrabutoxide (Zr source), and titanium tetraisopropoxide (Ti source) was weighed so that a metal atom ratio (Pb:Mn:Zr:Ti) in the liquid became a value shown in Table 3. The concentration of the PZT-based precursor in 100 mass % of the composition was adjusted to be 25 mass %, in terms of an oxide concentration. A piezoelectric film was formed on an orientation-controlled layer in which an orientation degree of the (110)/(101) plane was 90% and an orientation degree of the (100)/(001) plane was 0% by using the second method described above. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.02}Mn_{0.02}Zr_{0.52}Ti_{0.48}O_3$.

Comparative Example B1

Each PZT-based precursor of the Pb source, the Mn source, the Zr source, and Ti source which were the same as those in Example B4 was weighed so that a metal atom ratio (Pb:Mn:Zr:Ti) in the liquid became a value shown in Table 3. Except for the above-mentioned change, a composition was prepared in the same manner as in Example B4, and a piezoelectric film was formed by repeating the application, calcination, and sintering by using the same method as in Example B1. The formed piezoelectric film was a film having a composition shown as $Pn_{1.06}Mn_{0.05}Zr_{0.45}Ti_{.55}O_3$.

Example B8

A composition was synthesized by using the same method as in Example B1. Each PZT-based precursor of lead acetate trihydrate (Pb source), acetylacetone manganese (Mn source), niobium pentaethoxide (Nb source), zirconium tetrabutoxide (Zr source), and titanium tetraisopropoxide (Ti source) was weighed so that a metal atom ratio (Pb:Mn:Nb:Zr:Ti) in the liquid became a value shown in Table 3. The concentration of the PZT-based precursor in 100 mass % of the composition was adjusted to be 25 mass %, in terms of an oxide concentration. A piezoelectric film was formed on a PZT-based orientation-controlled layer in which an orientation degree of the (100)/(001) plane was 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.02}Mn_{0.02}Nb_{0.01}Zr_{0.52}Ti_{0.48}O_3$.

Example B9

A composition was synthesized by using the same method as in Example B1. Each PZT-based precursor of lead acetate trihydrate (Pb source), acetylacetone manganese (Mn source), niobium pentaethoxide (Nb source), zirconium tetrabutoxide (Zr source), and titanium tetraisopropoxide (Ti source) was weighed so that a metal atom ratio (Pb:Mn:Nb:Zr:Ti) in the liquid became a value shown in Table 3. The concentration of the PZT-based precursor in 100 mass % of the composition was adjusted to be 25 mass %, in terms of an oxide concentration. A piezoelectric film was formed on a orientation-controlled layer in which an orientation degree of the (100)/(001) plane was 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.02}Mn_{0.02}Nb_{0.01}Zr_{0.40}Ti_{0.60}O_3$.

Example B10

A composition was synthesized by using the same method as in Example B1. Each PZT-based precursor of lead acetate trihydrate (Pb source), acetylacetone manganese (Mn source), lanthanum acetate 1.5 hydrate (La source), zirconium tetrabutoxide (Zr source), and titanium tetraisopropoxide (Ti source) was weighed so that a metal atom ratio (Pb:La:Mn:Zr:Ti) in the liquid became a value shown in Table 3. The concentration of the PZT-based precursor in 100 mass % of the composition was adjusted to be 25 mass %, in terms of an oxide concentration. A piezoelectric film was formed on a PZT-based orientation-controlled layer in which an orientation degree of the (100)/(001) plane was 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.01}La_{0.01}Mn_{0.02}Zr_{0.55}Ti_{0.45}O_3$.

Example B11

A composition was synthesized by using the same method as in Example B1. Each PZT-based precursor of lead acetate trihydrate (Pb source), acetylacetone manganese (Mn source), lanthanum acetate 1.5 hydrate (La source), zirconium tetrabutoxide (Zr source), and titanium tetraisopropoxide (Ti source) was weighed so that a metal atom ratio (Pb:La:Mn:Zr:Ti) in the liquid became a value shown in Table 3. The concentration of the PZT-based precursor in 100 mass % of the composition was adjusted to be 25 mass %, in terms of an oxide concentration. A piezoelectric film was formed on a PZT-based orientation-controlled layer in which an orientation degree of the (100)/(001) plane was 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.011}La_{0.02}Mn_{0.02}Zr_{0.50}Ti_{0.50}O_3$.

Example B12

A composition was synthesized by using the same method as in Example B1. Each PZT-based precursor of lead acetate trihydrate (Pb source), acetylacetone manganese (Mn source), lanthanum acetate 1.5 hydrate (La source), zirconium tetrabutoxide (Zr source), and titanium tetraisopropoxide (Ti source) was weighed so that a metal atom ratio (Pb:La:Mn:Zr:Ti) in the liquid became a value shown in Table 3. The concentration of the PZT-based precursor in 100 mass % of the composition was adjusted to be 25 mass %, in terms of an oxide concentration. A piezoelectric film was formed on a PZT-based orientation-controlled layer in which an orientation degree of the (100)/(001) plane was 96%. Except for the above-mentioned changes, a composition was prepared in the same manner as in Example B1, and a piezoelectric film was formed by repeating the application, calcination, and sintering by using the same method as in Example B1. The formed piezoelectric film was a film having a composition shown as $Pb_{1.01}La_{0.01}Mn_{0.02}Zr_{0.52}Ti_{0.48}O_3$.

<Comparative Test and Evaluation>

Regarding the piezoelectric films formed in Example B1 to Example B12 and Comparative Example B1, a film thickness, an orientation degree of an orientation-controlled layer, a piezoelectric constant, an orientation degree of a piezoelectric film, and deviation of hysteresis curve of polarization-electric field properties (hereinafter, simply referred to as "deviation of hysteresis") were evaluated. The composition and the result of the film thickness of the piezoelectric films formed in Example B1 to Example B12 and Comparative Example B1 are shown in Table 3. The results of the orientation degree of an orientation-controlled layer, the piezoelectric constant, the orientation degree of a piezoelectric film, and the deviation of hysteresis are shown in Table 4.

(i) Film thickness of the piezoelectric film: a thickness (total thickness) of a cross-section of the piezoelectric film was measured with SEM (S4300 manufactured by Hitachi, Ltd.).

(ii) Piezoelectric constant: a piezoelectric constant d33 of the piezoelectric film was measured by using DBLI manufactured by aixACCT Systems. Specifically, a capacitor structure was prepared by the same method as the method of measuring "(iv) deviation (shift amount) of the hysteresis" which will be described later, and a displacement amount of the film when applying 25 V was measured, and an inclination of displacement with respect to the voltage was set as a piezoelectric constant d33.

(iii) Orientation degree: an orientation degree was measured by a concentration method using a CuKα ray by using an X-ray diffraction (XRD) device (type name: Empyrean manufactured by PANalytical B.V.). From the obtained diffraction result, peak intensity of the (100) plane or (001) plane, peak intensity of the (110) plane or (101) plane, and peak intensity of the (111) plane were measured and calculated by using the following Formula (4) to obtain an orientation degree of the (100) plane or (001) plane (in the following Formula, shown as "(100)/(001) orientation degree"). Since it was difficult to separate peaks of the (100) plane and the (001) plane, and the (110) lane and (101) plane by using a CuKα ray in the PZT-based thin film close to an MPB composition, each intensity was shown as (100)/(001) and (110)/(101).

(100)/(001) orientation degree=intensity of (100)/(001) plane/{intensity of (100)/(001) plane+intensity of (110)/(101) plane+intensity of (111) plane}  (4)

(iv) Deviation (shift amount) of the hysteresis: first, a pair of electrodes having a diameter of 200 μmϕ were formed on the upper surface of the piezoelectric film by using a sputtering method, the piezoelectric film was maintained in the oxygen atmosphere at 700° C. for 1 minute using the RTA, and annealed to recover damage, and a capacitor structure was prepared. Then, by using these as test samples, the hysteresis of the polarization quantity of the piezoelectric film was measured by applying a voltage of 25 V at a frequency of 1 kHz by using TF analyzer 2000, and a coercive electric field (Ec) was obtained. The obtained deviation D of hysteresis of the polarization quantity was acquired from Formula (2) described above.

TABLE 3

| | Metal atom ratio in composition (Pb:Mn:Zr:Ti) | Composition of Mn-doped PZT-based piezoelectric film (Metal atom ratio) | | | | | | Film thickness [μm] |
|---|---|---|---|---|---|---|---|---|
| | | Pb | Mn | Zr | Ti | Nb | La | |
| Example B1 | 1.11:0.01:0.52:0.48 | 1.01 | 0.01 | 0.52 | 0.48 | — | — | 1.2 |
| Example B2 | 1.12:0.02:0.52:0.48 | 1.02 | 0.02 | 0.52 | 0.48 | — | — | 3.0 |
| Example B3 | 1.14:0.042:0.55:0.45 | 1.03 | 0.042 | 0.52 | 0.48 | — | — | 1.0 |
| Example B4 | 1.12:0.02:0.45:0.55 | 1.02 | 0.02 | 0.45 | 0.55 | — | — | 0.8 |
| Example B5 | 1.12:0.02:0.52:0.48 | 1.02 | 0.02 | 0.52 | 0.48 | — | — | 1.2 |
| Example B6 | 1.15:0.005:0.52:0.48 | 1.02 | 0.005 | 0.52 | 0.48 | — | — | 1.2 |
| Example B7 | 1.11:0.02:0.52:0.48 | 1.02 | 0.02 | 0.52 | 0.48 | — | — | 1.2 |
| Comparative Example B1 | 1.15:0.05:0.45:0.55 | 1.06 | 0.05 | 0.45 | 0.55 | — | — | 1.2 |
| Example B8 | 1.14:0.02:0.01:0.52:0.48*1 | 1.02 | 0.02 | 0.52 | 0.48 | 0.01 | — | 1.6 |
| Example B9 | 1.14:0.02:0.01:0.40:0.60*1 | 1.02 | 0.02 | 0.40 | 0.60 | 0.01 | — | 1.6 |
| Example B10 | 1.14:0.01:0.02:0.55:0.45*2 | 1.01 | 0.02 | 0.55 | 0.45 | — | 0.01 | 1.6 |

TABLE 3-continued

|  | Metal atom ratio in composition (Pb:Mn:Zr:Ti) | Composition of Mn-doped PZT-based piezoelectric film (Metal atom ratio) | | | | | Film thickness [μm] |
|---|---|---|---|---|---|---|---|
|  |  | Pb | Mn | Zr | Ti | Nb | La |  |
| Example B11 | 1.15:0.02:0.02:0.50:0.50*2 | 1.011 | 0.02 | 0.50 | 0.50 | — | 0.02 | 1.6 |
| Example B12 | 1.14:0.01:0.02:0.52:0.48*2 | 1.01 | 0.02 | 0.52 | 0.48 | — | 0.01 | 1.6 |

*1The metal atom ratios in the composition in Examples B8 and B9 is Pb:Mn:Nb:Zr:Ti.
*2The metal atom ratios in the composition in Examples B10 to B12 is Pb:La:Mn:Zr:Ti.

TABLE 4

|  | Orientation-controlled layer | | Piezoelectric film | | |
|---|---|---|---|---|---|
|  | Orientation | (100)/(001) orientation degree [%] | d33 [pm/V] | (100)/(001) orientation degree [%] | Deviation of hysteresis [kV/cm] |
| Example B1 | (100)/(001) | 96 | 180 | 99 | 10.1 |
| Example B2 | (100)/(001) | 96 | 197 | 99 | 12.7 |
| Example B3 | (100)/(001) | 96 | 148 | 96 | 21.3 |
| Example B4 | (100)/(001) | 96 | 135 | 95 | 17.2 |
| Example B5 | (100)/(001) | 76 | 168 | 82 | 8.8 |
| Example B6 | (100)/(001) | 96 | 190 | 99 | 0.2 |
| Example B7 | (110)/(101) | 0 | 151 | 0 | 0.3 |
| Comparative Example B1 | (100)/(001) | 96 | 72 | 95 | 42.3 |
| Example B8 | (100)/(001) | 96 | 186 | 95 | 10.2 |
| Example B9 | (100)/(001) | 96 | 153 | 95 | 21.3 |
| Example B10 | (100)/(001) | 96 | 190 | 98 | 22 |
| Example B11 | (100)/(001) | 96 | 173 | 97 | 12.5 |
| Example B12 | (100)/(001) | 96 | 181 | 99 | 13.8 |

(a) Relationship Between Orientation Degree and Deviation of Hysteresis

As shown in Table 3, in Example B1 to Example B5 and Example B8 to Example B12 it was confirmed that, although a DRA process was performed at 700° C. after the film was formed, deviation of hysteresis of at least 8.8 kV/cm was generated and a strong internal bias exists in the film. In contrast, when Example B2, Example B5, and Example B7 were compared to each other, in Example B5 and Example B7 in which the (100)/(001) orientation degree was deteriorated, deviation of hysteresis was decreased. From this result, it was found that a high orientation degree was necessary for obtaining greater deviation of hysteresis.

(b) Relationship Between Amount of Mn Added and Deviation of Hysteresis

When Example B1 to Example B5, Example B8 to Example B12, and Example B6 were compared to each other, it was found that, when the amount of Mn added to the film was less than 0.01 (Example B6) when the total mole number of Zr and Ti was set as 1, sufficient deviation of hysteresis was not obtained and the amount of Mn added was more preferably equal to or greater than 0.01. In Example B8 to Example B12, co-doping of Mn, La, and Nb was performed. When the amount of Mn added was set to be equal to or greater than 0.01, a PMnZT-based film having great deviation of hysteresis could be obtained in the same manner as in Example B1 to Example B5. From this result, it was found that a PMnZT-based film having great deviation of hysteresis could be obtained even when other elements were added to the PMnZT-based film and excellent temperature stability of polarization was obtained.

(c) Relationship of Amount of Mn Added and Piezoelectric Properties

When Example B1 to Example B12 and Comparative Example B1 were compared to each other, it was found that, when the amount of Mn added to the film exceeds 0.045 (Comparative Example B4) when the total mole number of Zr and Ti was set as 1, the piezoelectric constant was extremely decreased and a function as the piezoelectric body was deteriorated, and therefore, the amount of Mn added was necessarily equal to or smaller than 0.045. In Example B8 to Example B12, co-doping of Mn, La, and Nb was performed. When the amount of Mn added was set to be equal to or smaller than 0.0045, a PMnZT-based film functioning as a piezoelectric body without decreasing the piezoelectric constant in the same manner as in Example B1 to Example B5 was obtained.

(d) Relationship Between Film Thickness of Piezoelectric Film and Piezoelectric Properties In Example B1 to Example B12, since the film thickness of the piezoelectric film was equal to or greater than 0.8 μm, a PMnZT-based film functioning as a piezoelectric body without decreasing the piezoelectric constant was obtained. In Example B8 to Example B12, co-doping of Mn, La, and Nb was performed. When the film thickness of the piezoelectric film was set to be equal to or greater than 0.8 vim, a PMnZT-based film functioning as a piezoelectric body without decreasing the piezoelectric constant in the same manner as in Example B1 to Example B5 was obtained.

INDUSTRIAL APPLICABILITY

The composition for forming a Mn-doped PZT-based piezoelectric film of the first embodiment of the present invention can be used in the manufacturing of a configuration material of a composite electronic component such as a piezoelectric element, an IPD, or a pyroelectric element.

The Mn-doped PZT-based piezoelectric film of the second embodiment of the present invention can be suitably used as a configuration material of a composite electronic component such as a gyro sensor, an infrared sensor, a piezoelectric sensor, an ink jet head, and an auto focus.

The invention claimed is:

1. A composition for forming a Mn-doped PZT-based piezoelectric film formed of Mn-doped composite metal oxides, the composition comprising:
   PZT-based precursors containing metal atoms configuring the composite metal oxides;
   acetylacetone as a stabilizer;
   a diol as a solvent; and
   polyvinylpyrrolidone,
   wherein when a metal atom ratio in the composition is shown as Pb:Mn:Zr:Ti, the PZT-based precursors are contained so that Pb is satisfied to be from 1.05 to 1.15, Mn is satisfied to be from 0.02 to 0.042, Zr is satisfied to be from 0.45 to 0.55, Ti is satisfied to be from 0.45 to 0.55, and the total of Zr and Ti in a metal atom ratio is 1,
   a concentration of the PZT-based precursor in 100 mass % of the composition is from 17 mass % to 35 mass % in terms of an oxide concentration,
   an amount of acetylacetone contained in the composition is from 0.2 moles to 3 moles when the total amount of Pb, Mn, Zr, and Ti contained in the composition is 1 mole,
   the diol is propylene glycol or ethylene glycol,
   a rate of diol in 100 mass % of the composition is from 16 mass % to 56 mass %, and
   a molar ratio of polyvinylpyrrolidone to 1 mole of the PZT-based precursor is 0.005 moles to 0.25 moles, in terms of monomers.

2. The composition according to claim 1, further comprising:
   0.6 mass % to 10 mass % of linear monoalcohol having 6 to 12 carbon atoms.

3. A Mn-doped PZT-based piezoelectric film formed of Mn-doped composite metal oxides, which is formed using the composition according to claim 1 by using a CSD method and represented by a general formula $Pb_zMn_xZr_yTi_{1-y}O_3$,
   wherein when the total mole number of Zr and Ti in the composite metal oxides is set as 1 mole, a molar ratio of Pb is in a range of 1.05 to 1.10, and a molar ratio of Mn is in a range equal to or greater than 0.02 and less than 0.042.

4. The Mn-doped PZT-based piezoelectric film according to claim 3,
   wherein an orientation degree of the (100) plane or (001) plane obtained by X-ray diffraction is equal to or greater than 90%.

5. The Mn-doped PZT-based piezoelectric film according to claim 3,
   wherein, when the total mole number of Zr and Ti in the composite metal oxides is set as 1 mole,
   the PZT-based piezoelectric film is preferentially crystal-oriented to the (100) plane or (001) plane, and
   a film thickness is from 0.8 μm to 3 μm.

6. The Mn-doped PZT-based piezoelectric film according to claim 5,
   wherein an orientation degree of the (100) plane or (001) plane obtained by X-ray diffraction is equal to or greater than 95%.

7. The Mn-doped PZT-based piezoelectric film according to claim 6,
   wherein deviation D of a hysteresis loop of polarization-electric field properties obtained by the following Formula (1) is at least 8.8 kV/cm:
   $$D=E_c^+-[(E_c^++E_c^-)/2] \quad (1)$$
   (where, $E_c^+$ indicates an absolute value of a positive electric field value from 0 kV/cm when polarization quantity is 0 μC/cm², and $E_c^-$ indicates an absolute value of a negative electric field value from 0 kV/cm when polarization quantity is 0 μC/cm²).

8. The Mn-doped PZT-based piezoelectric film according to claim 5,
   wherein deviation D of a hysteresis loop of polarization-electric field properties obtained by the following Formula (1) is at least 8.8 kV/cm:
   $$D=E_c^+-[(E_c^++E_c^-)/2] \quad (1)$$
   (where, $E_c^+$ indicates an absolute value of a positive electric field value from 0 kV/cm when polarization quantity is 0 μC/cm², and $E_c^-$ indicates an absolute value of a negative electric field value from 0 kV/cm when polarization quantity is 0 μC/cm²).

* * * * *